(12) United States Patent
Salcedo

(10) Patent No.: US 8,416,543 B2
(45) Date of Patent: Apr. 9, 2013

(54) APPARATUS AND METHOD FOR ELECTRONIC CIRCUIT PROTECTION

(75) Inventor: Javier A Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 385 days.

(21) Appl. No.: 12/832,820

(22) Filed: Jul. 8, 2010

(65) Prior Publication Data

US 2012/0008242 A1 Jan. 12, 2012

(51) Int. Cl.
*H02H 9/00* (2006.01)

(52) U.S. Cl.
USPC .......................................................... 361/56

(58) Field of Classification Search ............ 361/56
See application file for complete search history.

(56) References Cited

U.S. PATENT DOCUMENTS

| | | | | |
|---|---|---|---|---|
| 3,436,667 | A * | 4/1969 | Kedson | 330/298 |
| 4,633,283 | A * | 12/1986 | Avery | 257/122 |
| 5,276,582 | A * | 1/1994 | Merrill et al. | 361/111 |
| 5,343,053 | A * | 8/1994 | Avery | 257/173 |
| 5,663,860 | A | 9/1997 | Swonger | |
| 5,742,084 | A | 4/1998 | Yu | |
| 5,781,389 | A * | 7/1998 | Fukuzako et al. | 361/56 |
| 6,137,140 | A | 10/2000 | Efland et al. | |
| 6,236,087 | B1 | 5/2001 | Daly et al. | |
| 6,404,261 | B1 * | 6/2002 | Grover et al. | 327/320 |
| 6,512,662 | B1 | 1/2003 | Wang | |
| 6,590,273 | B2 | 7/2003 | Okawa et al. | |
| 6,667,870 | B1 | 12/2003 | Segervall | |
| 6,960,792 | B1 | 11/2005 | Nguyen | |
| 7,034,363 | B2 * | 4/2006 | Chen | 257/355 |
| 7,038,280 | B2 | 5/2006 | Righter | |
| 7,071,528 | B2 | 7/2006 | Ker et al. | |
| 7,232,705 | B2 | 6/2007 | Righter | |
| 7,335,543 | B2 | 2/2008 | Chen et al. | |

(Continued)

FOREIGN PATENT DOCUMENTS

EP 0 168 678 A2 1/1986

OTHER PUBLICATIONS

Salcedo et al., Electrostatic Discharge Protection Framework for Mixed-Signal High Voltage CMOS Applications, IEEE Xplore, downloaded Feb. 23, 2010 at 12:53 EST.

(Continued)

*Primary Examiner* — Stephen W Jackson
*Assistant Examiner* — Angela Brooks
(74) *Attorney, Agent, or Firm* — Knobbe Martens Olson & Bear LLP

(57) ABSTRACT

Apparatuses and methods for electronic circuit protection are disclosed. In one embodiment, an apparatus comprises an internal circuit electrically connected between a first node and a second node, and a protection circuit electrically connected between the first node and the second node and configured to protect the internal circuit from transient electrical events. The protection circuit comprises a bipolar transistor having an emitter connected to the first node, a base connected to a third node, and a collector connected to a fourth node. The protection circuit further comprises a first diode electrically connected between the third node and the fourth node, and a second diode electrically connected between the second node and the fourth node. The first diode is an avalanche breakdown diode having an avalanche breakdown voltage lower than or about equal to a breakdown voltage associated with the base and the collector of the bipolar transistor.

36 Claims, 21 Drawing Sheets

U.S. PATENT DOCUMENTS

| | | |
|---|---|---|
| 7,345,341 B2 | 3/2008 | Lin et al. |
| 7,601,991 B2 | 10/2009 | Salcedo et al. |
| 7,714,357 B2 | 5/2010 | Hayashi et al. |
| 8,044,457 B2 | 10/2011 | Salcedo et al. |
| 2002/0122280 A1 | 9/2002 | Ker et al. |
| 2004/0207021 A1 | 10/2004 | Russ et al. |
| 2005/0087807 A1 | 4/2005 | Righter |
| 2005/0093069 A1 | 5/2005 | Logie |
| 2005/0151160 A1 | 7/2005 | Salcedo et al. |
| 2006/0109595 A1* | 5/2006 | Watanabe et al. ............... 361/56 |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2008/0067601 A1 | 3/2008 | Chen |
| 2009/0032838 A1 | 2/2009 | Tseng et al. |
| 2009/0230426 A1* | 9/2009 | Carpenter et al. ............ 257/173 |
| 2009/0309128 A1 | 12/2009 | Salcedo et al. |
| 2010/0327343 A1 | 12/2010 | Salcedo et al. |
| 2011/0303947 A1 | 12/2011 | Salcedo et al. |

OTHER PUBLICATIONS

Anderson et al., *ESD Protection under Wire Bonding Pads*, EOS/ESD Symposium 99-88, pp. 2A.4.1-2A.4.7 (1999).

International Search Report and Written Opinion of the International Searching Authority in counterpart International Appl. No. PCT/US2011/041203, dated Oct. 4, 2011, 84 pages.

International Search Report and Written Opinion of the International Searching Authority in counterpart International Appl. No. PCT/US2011/041281, dated Sep. 26, 2011, 90 pages.

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

* cited by examiner

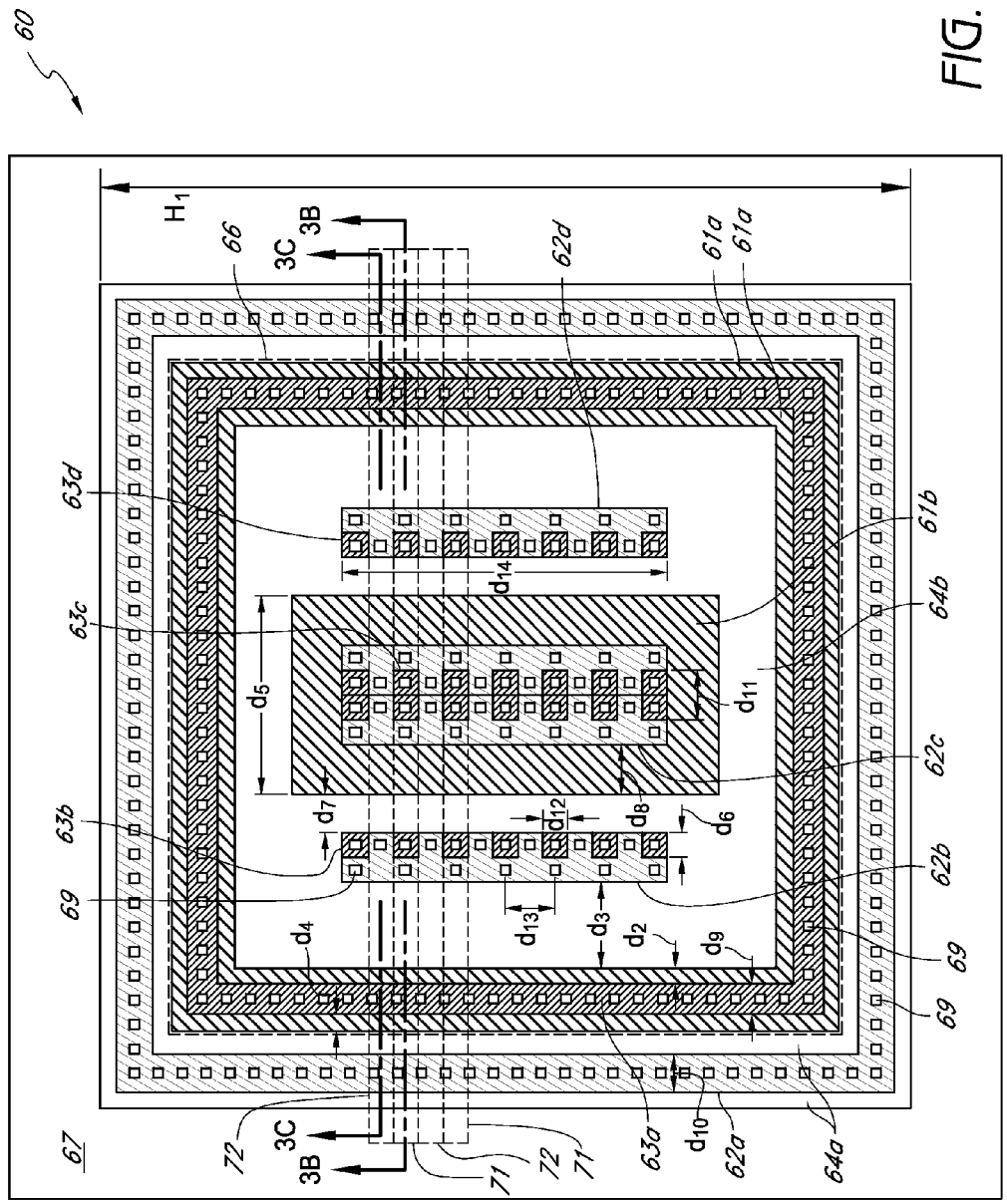

APPARATUS AND METHOD FOR ELECTRONIC CIRCUIT PROTECTION

BACKGROUND

1. Field

Embodiments of the invention relate to electronic systems, and more particularly, to protection circuits for integrated electronic systems.

2. Description of the Related Technology

Certain electronic systems can be exposed to a transient electrical event, or an electrical signal of a relatively short duration having rapidly changing voltage and high power. Transient electrical events can include, for example, electro static discharge (ESD) events arising from the abrupt release of charge from an object or person to an electronic system. Transient electrical events can also include, for example, voltage spikes resulting from delivering a varying current to an inductive load, signals received by way of electromagnetic inductive coupling, or transient electrical events arising from starting a motor, such as a load dump transient electrical event resulting from starting an automotive engine.

Transient electrical events can destroy an integrated circuit (IC) inside an electronic system due to overvoltage conditions and high levels of power dissipation over relatively small areas of the IC. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC from self-heating in the latch-up current path. Thus, there is a need to provide an IC with protection from such transient electrical events.

SUMMARY

In one embodiment, an apparatus comprises an internal circuit electrically connected between a first node and a second node, and a protection circuit electrically connected between the first node and the second node. The protection circuit is configured to protect the internal circuit from transient electrical events, and the protection circuit comprises a bipolar transistor having an emitter, a base, and a collector. The emitter is connected to the first node, the base is connected to a third node, and the collector is connected to a fourth node. The protection circuit further comprises a first diode electrically connected between the third node and the fourth node, and a second diode electrically connected between the second node and the fourth node. The first diode is an avalanche breakdown diode having the same polarity as the base and the collector of the bipolar transistor, respectively. A breakdown voltage associated with the first diode is lower than or about equal to a breakdown voltage associated with the base and the collector of the bipolar transistor.

In another embodiment, an apparatus for providing protection from transient electrical events is provided. The apparatus comprises a substrate, first well disposed in the substrate, a first active area disposed in the first well, a second active area disposed in the first well, and a second well adjacent the first well. The first well has a doping of a first type, the first active area has a doping of the first type, the second active area has a doping of a second type opposite that of the first type, and the second well has a doping of the second type. Additionally, the second active area, the first well, and the second well are configured to operate as a bipolar transistor having an emitter, a base, and a collector. The second active area, the first well, and the second well are configured to operate as the emitter, base, and collector of the bipolar transistor, respectively. The second active area surrounds at least a portion of the first active area so as to aid in recombining carriers injected into the first well from the second well before the carriers reach the first active area. Furthermore, the first well and the second well are configured to operate as an avalanche breakdown diode, wherein an avalanche breakdown voltage between the second well and the first well is lower than or about equal to a breakdown voltage between the second active area and the first well.

In another embodiment, a method for providing protection from transient electrical events is provided. The method comprises providing a substrate, forming a first well in the substrate, forming a second well adjacent the first well, forming a first active area in the first well, and forming a second active area in the first well. The first well has a doping of a first type, the second well has a doping of a second type opposite that of the first type, the first active area has a doping of the first type, and the second active area has a doping of the second type. Forming the second active area comprises surrounding at least a portion of the first active area using the second active area. Additionally, the second active area, the first well, and the second well are configured to operate as a bipolar transistor having an emitter, a base, and a collector, wherein the second active area, the first well, and the second well are configured to operate as the emitter, base, and collector of the bipolar transistor, respectively. Furthermore, the first well and the second well are configured to operate as an avalanche breakdown diode, wherein an avalanche breakdown voltage between the second well and the first well is lower than or about equal to a breakdown voltage between the second active area and the first well.

BRIEF DESCRIPTION OF THE DRAWINGS

FIG. 3A is a schematic top plan view of an IC protection circuit building block forming the circuit of FIG. 2A in accordance with one embodiment.

DETAILED DESCRIPTION OF EMBODIMENTS

Figure 1A:
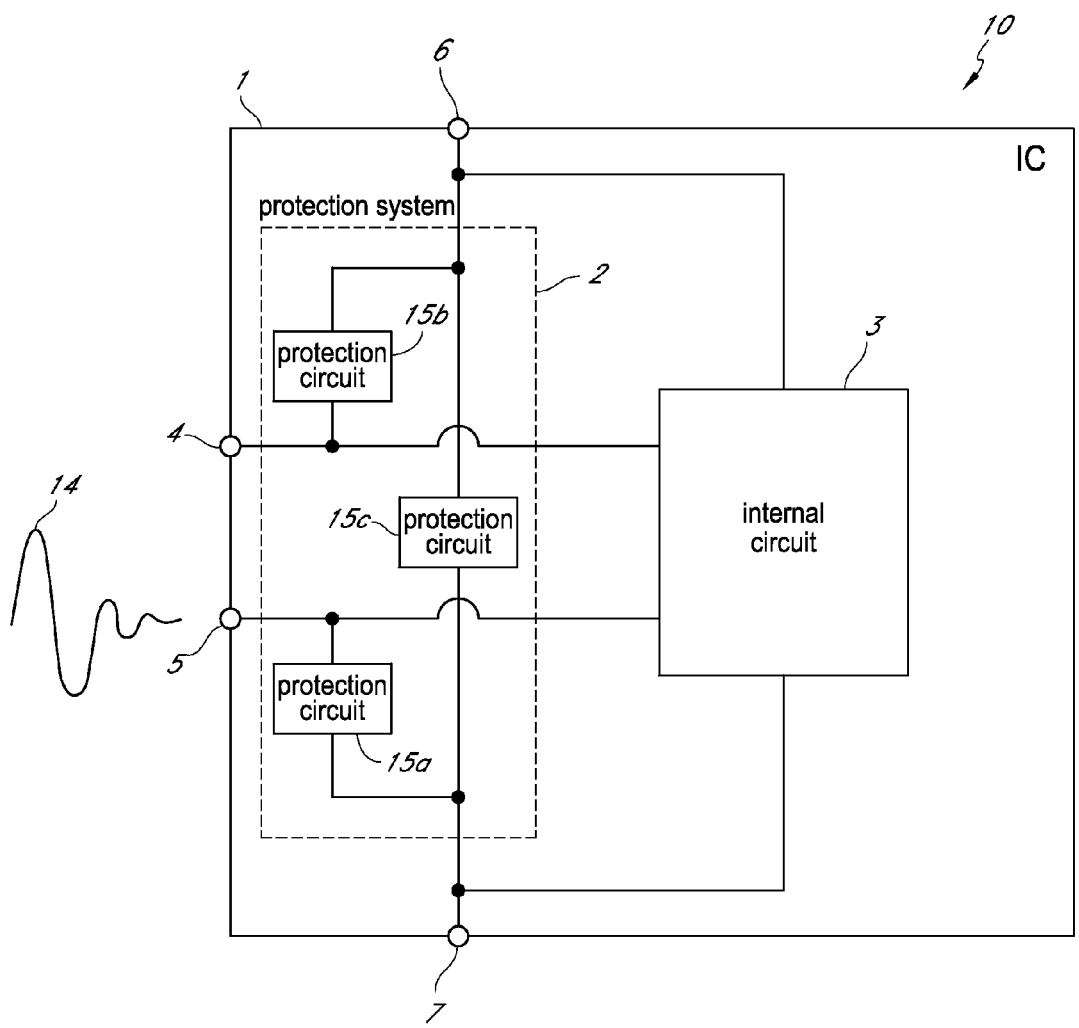
FIG. 1A is a schematic block diagram of one example of an electronic system including an integrated circuit (IC) and a protection system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Certain electronic systems are configured to protect circuits or components therein from transient electrical events. Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events as discussed above, including ESD events.

Electronic circuit reliability can be improved by providing pad protection circuits to the pads of an IC. Such a pad protection circuit can also be generally referred to as an "IC protection circuit" in this document. The pad protection circuits can maintain the voltage level at the pad within a predefined safe range, and can transition from a high-impedance state to a low-impedance state when the voltage of the transient electrical event reaches a trigger voltage. Thereafter, the pad protection circuit can shunt a portion of the current associated with the transient electrical event before the voltage of a transient electrical event reaches a failure voltage that can cause damage to the IC. As will be described in detail later with reference to FIG. 1B, the pad protection circuit can remain in the low-impedance state as long as the transient electrical event voltage level is above a holding voltage.

An integrated circuit (IC) can include one or more pads exposed to a relatively high operational voltage. In certain applications, the holding voltage should be higher than the operating voltage (in magnitude) so that the pad protection circuit does not remain in the low-impedance state after passage of the transient electrical event. Furthermore, the pad protection circuit should be able to return to normal operating voltage levels without interrupting the circuit functionality of the IC. For example, these characteristics can be desirable in ICs to be used in certain automotive, medical, and industrial processes having a zero defect target so as to minimize the risk to human health or lives which could result from IC failure.

In certain embodiments, pad protection circuit are configured to have "Z"-type current versus voltage characteristic response, in which the pad protection circuit can activate at a preselected voltage level and over a relatively narrow band of voltage, so as to transition relatively quickly between an off-state condition and an on-state condition. The "Z"-type characteristic response can be desirable for realizing high performance, high reliability, and high operational voltage in certain applications. Alternative approaches, such as widening transistor or diode elements of the pad protection circuit can increase the holding voltage, but can also produce undesirable side-effects, such as substantially enlarging area, increasing leakage current and/or increasing capacitive loading. Likewise, stacking pad protection sub-circuits in a cascade can increase the holding voltage, but can also increase the area of the pad protection circuit.

There is a need for a pad protection circuit having a high operational voltage and a high holding voltage. There is also a need for a pad protection circuit which can provide transient electrical event protection against both negative and positive transient signals, and which can have fast operational performance, low static power dissipation, and a small circuit area. Furthermore, there is a need for a pad protection circuit having a "Z"-type current versus voltage characteristic response.

Overview of Electronic Systems with a Protection System

FIG. 1A is a schematic block diagram of an electronic system 10, which can include one or more pad protection circuits according to some embodiments. The illustrated electronic system 10 includes an integrated circuit (IC) 1 that includes a protection system 2, an internal circuit 3, and pins or pads 4-7. The internal circuit 3 can be electrically connected to one or more of the pads 4-7. Each of the pads 4-7 can be, for example, one of power pads, ground pads, input pads, output pads, or bidirectional pads.

The IC 1 can be exposed to transient electrical events, such as ESD events, which can cause IC damage and induce latch-up. For example, the pad 5 can receive a transient electrical event 14, which can travel along electrical connections of the IC 1 and reach the internal circuit 3. The transient electrical event 14 can produce overvoltage conditions and can dissipate high levels of power, which can disrupt the functioning of the internal circuit 3 and potentially cause permanent damage.

In some embodiments, a protection system 2 can be provided to ensure reliability of the IC 1 by maintaining the voltage level at the pads of the IC 1 within a particular range of voltage, which can vary from pad to pad. The protection system 2 can include one or more pad protection circuits, such as the pad protection circuits 15a-15c. The pad protection circuits 15a-15c can be configured to divert a current associated with a transient electrical event received on a pad of the IC to other nodes or pads of the IC, thereby providing transient electrical event protection, as will be described in further detail below.

Pad protection circuits can be placed, for example, between a power pad and an input pad, between a power pad and an output pad, between a power pad and a bidirectional pad, between a ground pad and an input pad, between a ground pad and an output pad, between a ground pad and a bidirectional pad, and/or between a power pad and a ground pad. When no transient electrical event is present, the pad protection circuit can remain in a high-impedance/low-leakage state, thereby minimizing static power dissipation resulting from leakage current.

The protection system 2 can be integrated on-chip with the IC 1. However, in other embodiments, the protection system 2 can be arranged in a separate IC. For example, the protection system 2 can be included in a separately packaged IC, or it can be encapsulated in a common package with the IC 1. In such embodiments, one or more pad protection circuits can be placed in a stand-alone IC, in a common package for system-on-a-package applications, or integrated with an IC in a common semiconductor substrate for system-on-a-chip applications.

The IC 1 can be used in, for example, transmission line systems, industrial control, power management systems, microelectromechanical system (MEMS) sensors, transducers, automotive local interconnect network (LIN) and controller interface network (CAN) interface systems, or a variety of other systems. The IC 1 can be utilized in electronic systems in which the pins of the IC are exposed to user contact through a low-impedance connection.

Figure 1B:
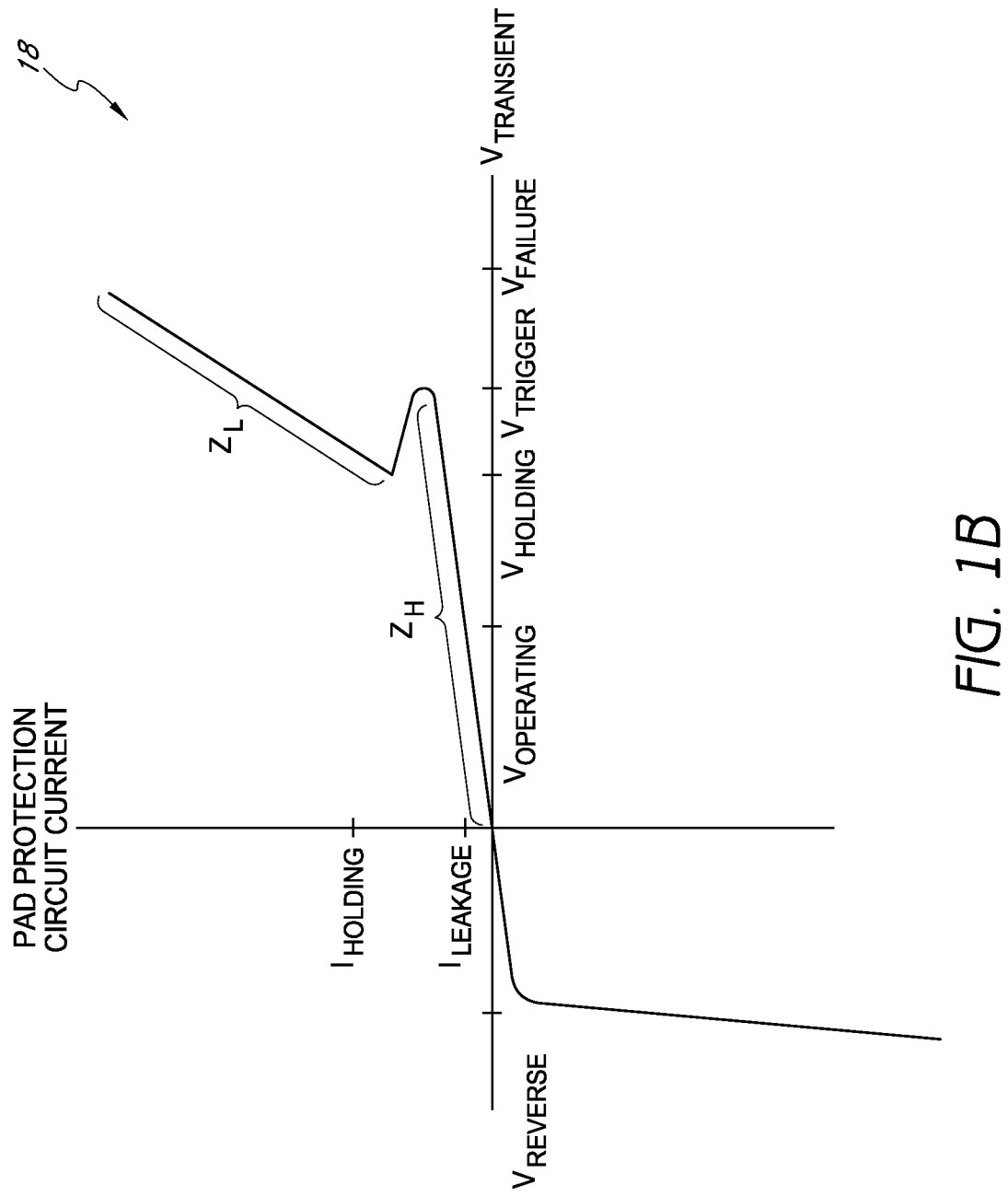
FIG. 1B is a graph of one example of IC protection circuit current versus transient electrical event voltage.

FIG. 1B is a graph 18 of one example of pad protection circuit current versus transient electrical event voltage. As described above, a pad protection circuit can be configured to maintain the voltage level at a pad within a predefined safe range. Thus, the pad protection circuit can shunt a large portion of the current associated with the transient signal event before the voltage of the transient signal $V_{TRANSIENT}$ reaches a voltage $V_{FAILURE}$ that can cause damage to the IC 1. Additionally, the pad circuit can conduct a relatively low current at the normal operating voltage $V_{OPERATING}$, thereby reducing or minimizing static power dissipation resulting from the leakage current $I_{LEAKAGE}$ which enhances the energy efficiency of the IC.

Furthermore, as shown in the graph 18, the pad protection circuit can transition from a high-impedance state $Z_H$ to a low-impedance state $Z_L$ when the voltage of the transient signal $V_{TRANSIENT}$ reaches the voltage $V_{TRIGGER}$. Thereafter, the pad circuit can shunt a large current over a wide range of transient electrical event voltage levels. The pad circuit can remain in the low-impedance state $Z_L$ as long as the transient signal voltage level is above a holding voltage $V_{HOLDING}$. By configuring the pad protection circuit to have both a trigger voltage $V_{TRIGGER}$ and a holding voltage $V_{HOLDING}$, the pad protection circuit can have improved performance while having enhanced stability against unintended activation. In certain embodiments, it can be specified for the holding voltage $V_{HOLDING}$ to be above the operating voltage $V_{OPERATION}$ and to have a "Z"-type current versus voltage characteristic response so that the pad circuit does not remain in the low-impedance state $Z_L$ after passage of the transient signal event and a relatively quick return to normal operating voltage levels.

In certain embodiments, pad protection circuits can also shunt a large current for transient signal events having a negative voltage, so that the protection circuit can provide transient electrical event protection against both negative and positive transient signals. Thus, in certain embodiments, pad protection circuits can provide a current path when the voltage of the transient signal $V_{TRANSIENT}$ reaches the reverse trigger voltage $V_{REVERSE}$. The reverse trigger voltage $V_{REVERSE}$ can be relatively far from the operating voltage $V_{OPERATING}$, and thus, in certain embodiments, separate reverse trigger and reverse holding voltages need not be employed.

Pad Protection Circuits

Figure 2A:
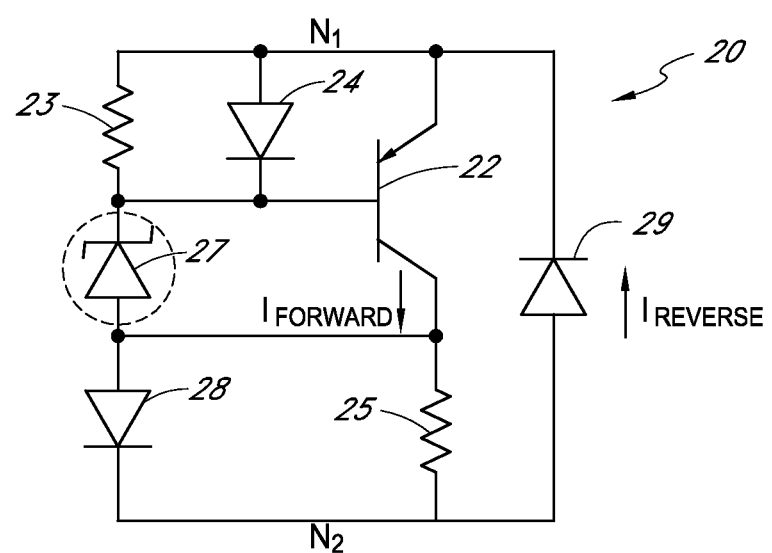
FIG. 2A is a circuit diagram illustrating an IC protection circuit in accordance with one embodiment.

FIG. 2A is a circuit diagram of a pad protection circuit 20 in accordance with one embodiment. The illustrated pad protection circuit 20 includes a first resistor 23, a second resistor 25, a first diode 24, a second diode 27, a third diode 28, a fourth diode 29, and a PNP bipolar transistor 22 having an emitter, a base, and a collector.

The first diode 24 includes an anode electrically connected to a first end of the first resistor 23, the emitter of the PNP bipolar transistor 22, and a cathode of the fourth diode 29 at a node labeled $N_1$. The first diode 24 further includes a cathode electrically connected to the base of the PNP bipolar transistor 22, a second end of the first resistor 23, and a cathode of the second diode 27. The second diode 27 further includes an anode electrically connected to the collector of the PNP bipolar transistor 22, an anode of the third diode 28, and a first end of the second resistor 25. The second diode 27 can be an avalanche breakdown diode, having a breakdown characteristic similar to that of a Zener diode or an avalanche diode. The third diode 28 further includes a cathode electrically connected to a second end of the second resistor 25 and to an anode of the fourth diode 29 at a node labeled $N_2$.

The pad protection circuit 20 can be connected between a pad of an IC (for example, the IC 1 of FIG. 1) and a low impedance node or pad of the IC, as was described earlier. The pad may receive a transient electrical event (for example, the event 14 of FIG. 1), which can be potentially damaging to one or more portions of the IC.

The pad protection circuit 20 can protect an IC from a transient electrical event having either positive or negative voltage amplitude by providing, for example, a "Z"-type current versus voltage characteristic response. For example, a transient electrical event can cause the voltage of the node $N_1$ to become negative with respect to the voltage of the node $N_2$. As the voltage of the node $N_1$ decreases relative to the voltage of the node $N_2$, the fourth diode 29 can become forward biased and have a relatively low on-state resistance, thereby providing a current path between the nodes $N_1$ and $N_2$ and providing transient electrical event protection to the IC. This path of current flow will hereinafter be referred to as the reverse conduction path $I_{REVERSE}$.

Likewise, the pad protection circuit 20 can provide "Z"-type characteristic response protection against a transient electrical event which can cause the voltage of the node $N_1$ to be positive with respect to the voltage of the node $N_2$ and greater than a selected trigger voltage. As the voltage of the node $N_1$ increases, the reverse bias voltage of the second diode 27 can increase until the second diode 27 reaches a breakdown/avalanche condition, such as a breakdown resulting from an avalanche effect and/or Zener effect, in which the second diode 27 in combination with the bipolar transistor 22 can conduct a relatively large breakdown current. For example, the breakdown voltage can be in a range of about 15 V to about 80 V. However, a very wide range of breakdown voltages can be used, and an applicable breakdown voltage will be readily determined by one of ordinary skill in the art. The breakdown current of the second diode 27 can cause a flow of current through the resistor 23, the first diode 24, and the base of the PNP bipolar transistor 22. The flow of current through the first resistor 23 and the first diode 24 can build a forward-bias between the base and emitter of the PNP bipolar transistor 22, which can enhance the direct injection of mobile carriers through the blocking junction of the second diode 27 and aids the rapid conductivity modulation (change of impedance) when the device reaches the on-state. Furthermore, the portion of the breakdown current that flows through the base of the PNP bipolar transistor 22 can stimulate an amplified flow of current from the collector of the PNP bipolar transistor 22.

The current from the collector of the bipolar transistor 22 can flow through the second resistor 25 and the second diode 28. A voltage potential can build across the second resistor 25, and the third diode 28 can become forward biased. Forward biasing the third diode 28 can lead to an increase in the collector current of the PNP bipolar transistor 22, and can lead to the occurrence of high-level injection conditions in the PNP bipolar transistor 22. Thus, a low-impedance path can be developed between the node $N_1$ and the node $N_2$ through the PNP bipolar transistor 22 and the third diode 28, which can aid in shunting a portion of the current associated with a transient electrical event. This low-impedance current flow between the node $N_1$ and the node $N_2$ through the PNP bipolar transistor 22 will hereinafter be referred to as the forward conduction path $I_{FORWARD}$.

As described above, the pad protection circuit 20 can protect an IC from a transient electrical event having either positive or negative voltage polarity. Using a single pad protection circuit 20 to provide protection against both positive and negative transient electrical events can permit a reduction in layout area relative to a design that uses separate structures for protection against positive and negative transient electrical events.

The first resistor 23 can have, for example, a resistance between about 90Ω about 560Ω. The second resistor 25 can have, for example, a resistance between about 110Ω about 260Ω. In one embodiment, the first resistor 23 and the second resistor 25 can be implemented by employing the resistivity of n-type and p-type wells, respectively, to achieve the target resistances. In certain embodiments, the first and/or second resistors 23, 25 can be omitted or have relatively high resistances so as to approximate an open circuit, as will be described in detail below with reference to FIGS. 6A-6C.

The value of the first and second resistors 23, 25 can be selected to achieve a turn-on speed and stability desired for a particular application. For example, the resistance of the second resistor 25 can be reduced to provide enhanced stability against false triggering of the pad protection circuit 20, and can be increased to permit a faster build-up of bias across the third diode 28 and a resulting improvement in turn-on speed. Similarly, the resistance of the first resistor 23 can be reduced to provide enhanced stability against false triggering of the pad protection circuit 20, such as in the case of interface pins operating at a relatively high frequency or switching at a relatively high speed. Alternatively, the resistance of the first resistor 23 can be increased to permit a faster build-up of bias across the base and emitter of the PNP bipolar transistor 22 and a resulting improvement in turn-on speed. Thus, the first and second resistors 23, 25 can be tuned to achieve the desired degree of turn-on speed and stability.

Figure 2B:
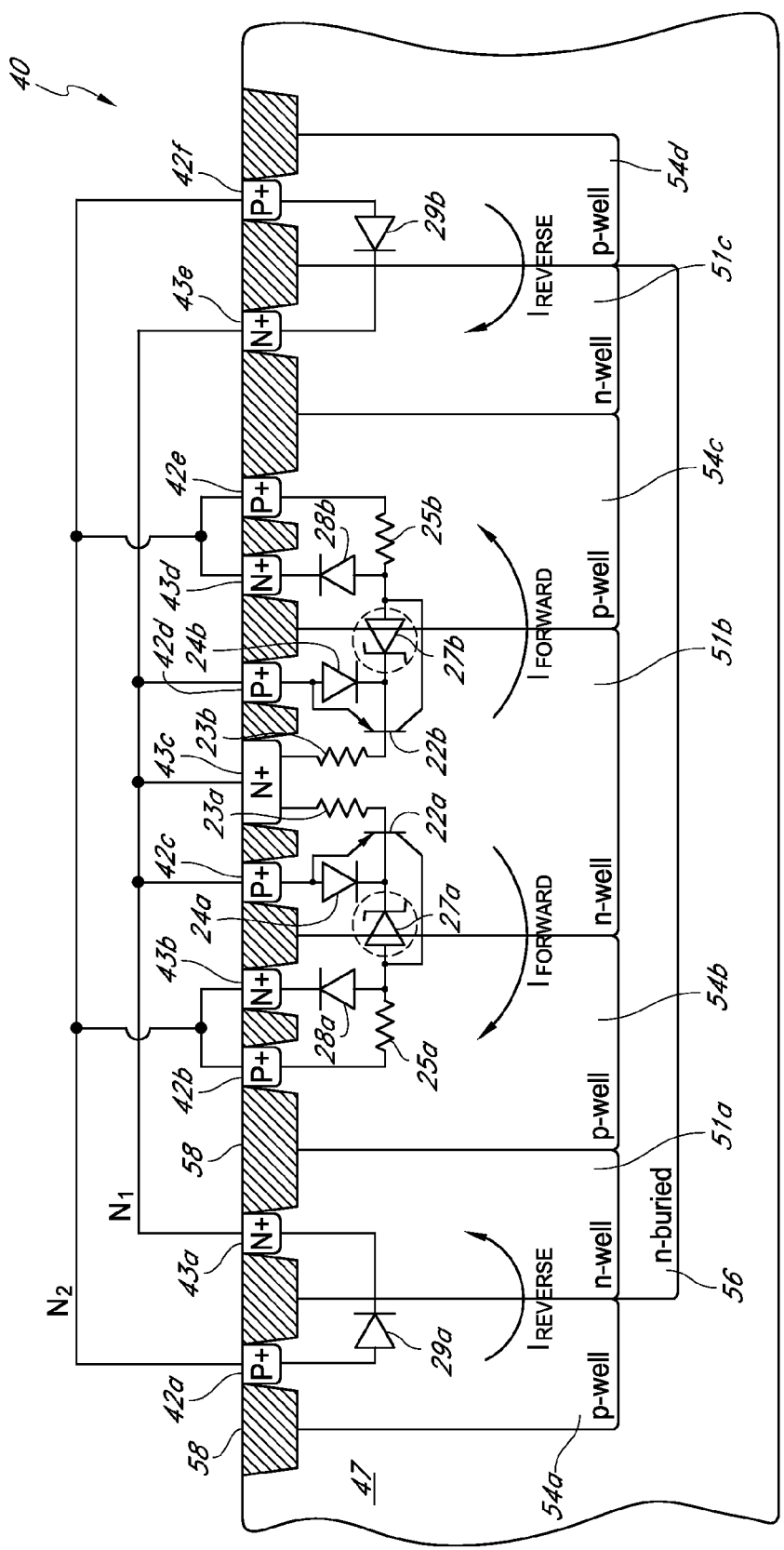
FIG. 2B is an annotated cross section of one implementation of the IC protection circuit of FIG. 2A.

FIG. 2B is an annotated cross section of one implementation of the pad protection circuit of FIG. 2A. The illustrated pad protection circuit 40 includes a substrate 47, n-type active areas 43a-43e, p-type active areas 42a-42f, n-wells 51a-51c, p-wells 54a-54d, n-type buried layer 56, and shallow trench isolation regions 58. The cross section has been annotated to show certain circuit devices formed from the layout, such as PNP bipolar transistors 22a, 22b, first resistors 23a, 23b, second resistors 25a, 25b, first diodes 24a, 24b, second diodes 27a, 27b, third diodes 28a, 28b, and fourth diodes 29a, 29b. The pad protection circuit 40 can undergo back end processing to form contacts and metallization. Skilled artisans will appreciate that these details have been omitted from this figure for clarity.

The first diodes 24a, 24b can be formed from the p-type active areas 42c, 42d, and the n-well 51b. For example, the diode 24a can have an anode formed from the p-type active area 42c and a cathode formed from the n-well 51b, and the diode 24b can have an anode formed from the p-type active area 42d and a cathode formed from the n-well 51b. The second diodes 27a, 27b can be formed from the p-wells 54b, 54c and the n-well 51b. For example, the diode 27a can have an anode formed from the p-well 54b and a cathode formed from the n-well 51b, and the diode 27b can have an anode formed from the p-well 54c and a cathode formed from the n-well 51b. The second diodes 27a, 27b can operate as breakdown/avalanche diodes. For example, the second diode 27a can have a breakdown voltage associated with the breakdown of the n-well 51b/n-buried layer 56 and the p-well 54b, and the second diode 27b can have a breakdown voltage associated with the breakdown of the n-well 51b/n-buried layer 56 and the p-well 54c. In one embodiment, the breakdown voltage of the diodes 27a, 27b can be configured to be higher than a breakdown voltage associated with punch-through of the p-n junctions defined between the p-well 54b and the n-type active area 43b, the p-well 54c and the n-type active area 43d, the p-type active area 42c and the n-well 51b, and the p-type active area 42d and the n-well 51b.

The third diodes 28a, 28b and the fourth diodes 29a, 29b can be formed from the illustrated layout structure as well. The diode 28a can have an anode formed from the p-well 54b and a cathode formed from the n-type active area 43b, and the diode 28b can have an anode formed from the p-well 54c and a cathode formed from the n-type active area 43d. Additionally, the diode 29a can have an anode formed from the p-well 54a and a cathode formed from the n-well 51a, and the diode 29b can have an anode formed from the p-well 54d and a cathode formed from the n-well 51c.

The PNP bipolar transistors 22a, 22b can be formed from the p-type active areas 42c, 42d, the p-wells 54b, 54c, and the n-well 51b. For example, the PNP bipolar transistor 22a can have an emitter formed from the p-type active area 42c, a base formed from the n-well 51b, and a collector formed from the p-well 54b. Likewise, the PNP bipolar transistor 22b can have an emitter formed from the p-type active area 42d, a base formed from the n-well 51b, and a collector formed from the p-well 54c.

The first resistors 23a, 23b can be formed from the resistance between the bases of PNP bipolar transistors 22a, 22b and the n-type active area 43c. For example, the resistance along the paths between the bases of the PNP bipolar transistors 22a, 22b and n-type active area 43c can be modeled by the first resistors 23a, 23b. The second resistors 25a, 25b can formed from the resistance between the collectors of PNP bipolar transistors 22a, 22b and the p-type active areas 42b, 42e. For example, the second resistor 25a can be formed from the resistance between the collector of the PNP bipolar transistor 22a and the p-type active area 42b, and the second resistor 25b can be formed from the resistance between the collector of the PNP bipolar transistor 22b and the p-type active area 42e.

The p-wells 54b, 54c can be electrically isolated from the substrate 41 using the n-wells 51a, 51c and the n-type buried layer 56. Electrically isolating the p-wells 54b, 54c permits the p-wells 54b, 54c to serve as the collectors of the PNP bipolar transistors 22a, 22b. The n-type active areas 43a, 43e and the n-wells 51a, 51c can form a guard ring around the pad protection circuit 40, as will be described in further detail below. The guard ring can be employed to eliminate the formation of unintended parasitic paths between the pad protection circuit 40 and surrounding semiconductor components when integrated on-chip. Additionally, the p-wells 54a, 54d and the p-type active areas 42a, 42f can further aid in collecting mobile charges from the substrate and eliminating the formation of unintended parasitic paths and protecting the pad protection circuit 40 from latch-up.

Persons of ordinary skill in the art will appreciate that the cross-section shown in FIG. 2B can result in the formation of the circuit shown in FIG. 2A. For example, the emitters of the PNP bipolar transistors 22a, 22b can be electrically connected together to form a common emitter. Likewise, the collectors of the PNP bipolar transistors 22a, 22b can be electrically connected together to form a common collector. Furthermore, as shown in FIG. 2B, the base of the transistors can be common to both of the PNP bipolar transistors 22a, 22b. Thus, the PNP bipolar transistors 22a, 22b can be together represented as a single PNP bipolar transistor 22 of FIG. 2A. Additionally, the first diodes 24a, 24b, the second diodes 27a, 27b, the third diodes 28a, 28b, and the fourth diodes 29a, 29b can be represented by the first diode 24, the second diode 27, the third diode 28, and the fourth diode 29, respectively, of FIG. 2A. Furthermore, the first resistors 23a, 23b can be represented by the first resistor 23 of FIG. 2A, and the second resistors 25a, 25b can be represented by the second resistor 25 of FIG. 2A. Skilled artisans will appreciate that other layout implementations of the pad protection circuit 20 are possible.

For reasons similar to that described earlier with reference to FIG. 2A, the pad protection circuit 40 can protect an IC from a transient electrical event having either positive or negative voltage amplitude. For example, a transient electrical event can cause the voltage of the node $N_1$ to become negative with respect to the node $N_2$, and the fourth diodes 29a, 29b can become forward biased and conduct current along the reverse conduction path $I_{REVERSE}$ shown in FIG. 2B.

Likewise, a transient electrical event can cause the voltage of the node $N_1$ to become positive with respect to the node $N_2$. In such an event, a current can flow through the first resistors 23a, 23b, and the first diodes 24a, 24b, which can increase the collector currents of the PNP bipolar transistors 22a, 22b. The collector currents of the PNP bipolar transistors 22a, 22b can flow through the third diodes 28a, 28b and the second resistors 25a, 25b, as described earlier. Thus, current can flow from the node $N_1$ to the $N_2$ along the forward conduction path $I_{FORWARD}$ shown in FIG. 2B.

Providing separate forward and reverse conduction paths $I_{FORWARD}$, $I_{REVERSE}$ can permit separate customization of the conduction paths, while permitting bidirectional transient electrical protection of a pad using a single pad protection structure. This reduces the overhead of guard rings and other isolation structures relative to a pad protection scheme in which two different pad protection structures are employed per pad.

FIG. 3A is a top plan view of a pad protection circuit building block that can form the circuit of FIG. 2A and which can have a "Z"-type current versus voltage characteristic response. The pad protection circuit building block 60 can be instantiated multiple times between the same or different pads on-chip to achieve the desired level of transient electrical event protection. The pad protection circuit building block 60 includes a substrate 67, n-wells 61a, 61b, n-type active areas 63a-63d, p-wells 64a, 64b, p-type active areas 62a-62d, n-type buried layer 66, and contacts 69. The illustrated pad protection circuit building block 60 includes alternating first and second rows 71, 72, which can aid in forming a PNP bipolar transistor device and suppressing the formation of a NPN bipolar transistor device, as will be described in detail below.

A PNP bipolar transistor can be formed from the p-type active area 62c, n-well 61b, and p-well 64b. The PNP bipolar transistor can correspond to the PNP bipolar transistor 22 of FIG. 2A, and can be configured to have a relatively fast turn-on time in response to a transient electrical event.

In order to maintain a relatively high holding voltage of the pad protection circuit building block 60, for example, between about 25 V to about 60 V, or about ten percent higher than the maximum operating voltage of the pad electrically connected to the pad protection circuit, the formation of a NPN bipolar transistor between the n-type active area 63b, the p-well 64b, and the n-well 61b should be avoided. Formation of a NPN bipolar transistor can create a bipolar latch structure having cross-coupled PNP and NPN bipolar transistors, which can result in a relatively low holding voltage.

To inhibit the formation of an NPN bipolar structure and to maintain a high-holding voltage for the pad protection circuit building block 60, the p-type active area 62c can surround islands of n-type active area, such as the n-type active area 63c. By surrounding the islands of n-type active area in this manner, recombination of electrons injected into the n-well 61b from the islands of n-type active area can be increased. Additionally, the n-type active area 63b can be surrounded by the p-type active area 62b, which can further facilitate the recombination of electrons injected into the p-well 64b.

By reducing the flow of electrons in this manner, the formation of an NPN device from the n-type active area 63b, the p-well 64b, and the n-well 61-b can be suppressed even under relatively high injection conditions, and the holding voltage of the pad protection circuit building block 60 can be relatively high, while maintaining a relatively low on-state resistance per unit area. Furthermore, by suppressing the formation of a NPN structure in this manner, a reduction in the area of the pad protection circuit building block 60 can be achieved by permitting the n-type active area 63b to be positioned closely to the n-well 61b. Moreover, this approach can increase the area of the p-type active areas 62b-62d, which can stimulate the flow of holes from the emitter to the collector PNP bipolar transistor and can improve the turn-on speed of the pad protection circuit building block 60.

The configuration of the pad protection circuit building block 60 can encourage conduction in a lateral direction (parallel to the line 3B-3B when viewed from above the block 60) and inhibit breakdown of the pad protection circuit building block 60 in the vertical direction (perpendicular to the line 3B-3B when viewed from above the block 60). For example, the placement of the p-type active areas 62b-62d in columns encourages conduction in the lateral direction, since the conduction through the pad protection circuit building block 60 in the low-impedance state can be dominated by the flow of holes from the p-type active area 62c to the p-type active areas 62b, 62d.

The size of the PNP bipolar device formed from the p-type active area 62c, n-well 61b, and p-well 64b can be increased by expanding the height $H_1$ (see FIG. 3A) of the pad protection circuit building block 60 when viewed from above. For example, the number of first rows 71 and second rows 72 can be selected to achieve a desired impedance for the pad protection circuit building block 60. In one embodiment, the combined total number of alternating first and second rows can be selected to be in the range of about 60 to about 150 to increase current flow in the on-state and to avoid irregular conduction through the total number of rows (i.e., to avoid the creation of localized conduction path filaments that weaken the device current handling capability).

Figure 3B:
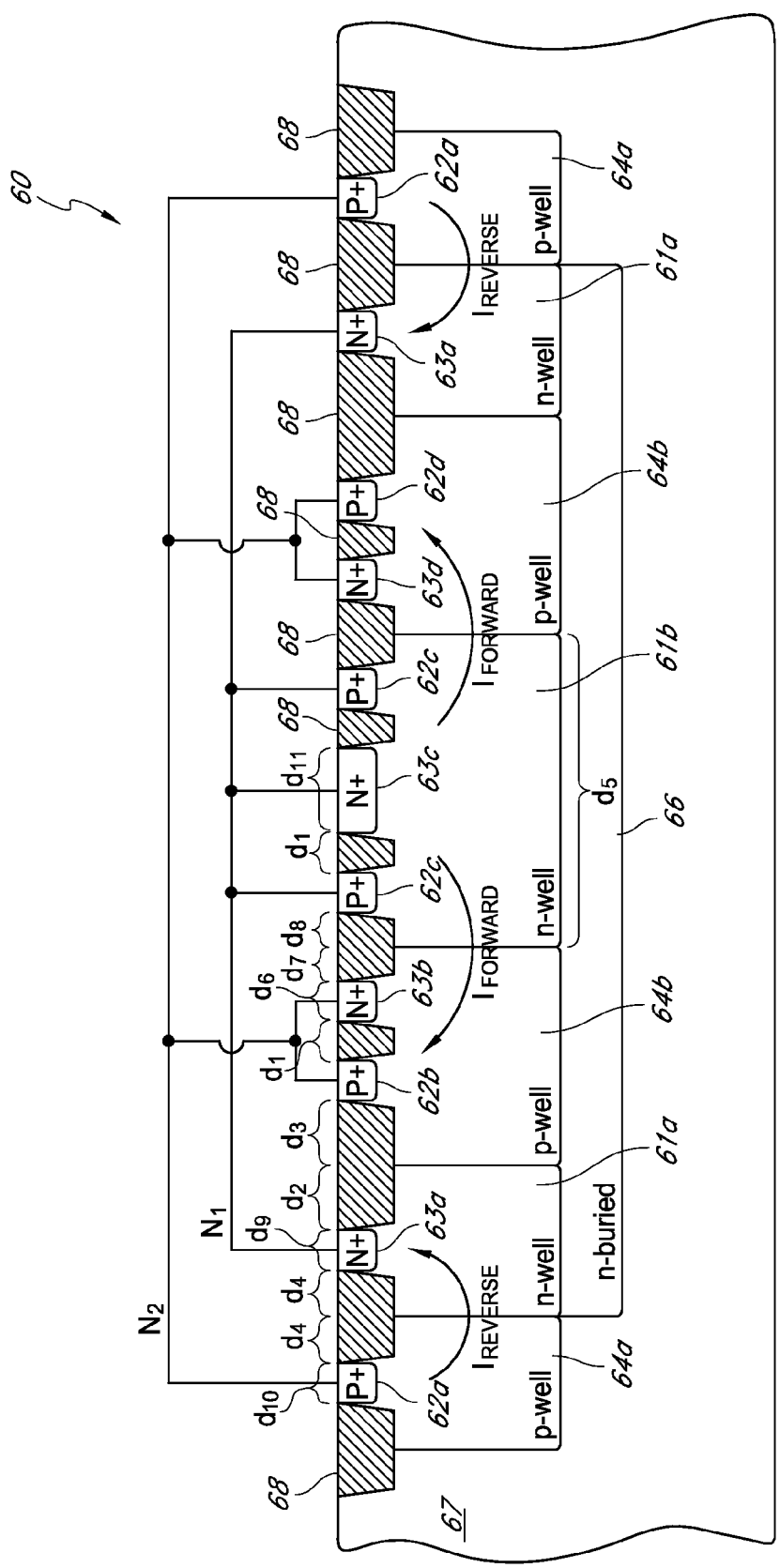
FIG. 3B is a cross section of the IC protection circuit building block of FIG. 3A, taken along the line 3B-3B.

FIG. 3B is a cross section of the pad protection circuit building block 60 of FIG. 3A, taken along the line 3B-3B. The pad protection circuit building block 60 includes a substrate 67, p-wells 64a, 64b, n-wells 61a, 61b, an n-type buried layer 66, p-type active areas 62a-62d, n-type active areas 63a-63d, and shallow trench isolation regions 68. The cross-section of FIG. 3B can correspond to a cross-section of the first row 71.

The pad protection circuit building block 60 can be used to form the pad protection circuit 20 of FIG. 2A, for reasons similar to that described above with reference to FIG. 2B.

A first spacing $d_1$ between the p-type active area 62c and the n-type active area 63c can be selected to be a relatively short distance, such as the minimum spacing permitted by the process technology. This can permit the p-type active area 62c to serve as a recombination center for electrons injected into the n-well 61b. Reducing the first spacing $d_1$ can increase the holding voltage of the pad protection circuit building block 60 while achieving a reduction in area. For example, the spacing $d_1$ can be in a range of about 0 μm (abutting) to about 1 μm. Other dimensions will be readily determined by one of skill in the art.

A second spacing $d_2$ between n-type active area 63a and the p-well 64b can be selected to allow for an increased isolation breakdown voltage between the n-well 61a and the p-well 64b. This can avoid reverse conduction between the n-well 61a and the p-well 64b before activation of the $I_{FORWARD}$ conduction path shown in FIG. 3B. For example, the second spacing $d_2$ can be in a range of about 4.5 μm to about 5 μm. Other dimensions will be readily determined by one of skill in the art.

A third spacing $d_3$ between p-type active area 62b and the n-well 61a can be selected to provide electrical isolation between the p-type active area 62b and the n-well 61a, and can be increased to reduce charge associated with the forward conduction path $I_{FORWARD}$ from being injected into the n-well 61a. Increasing the third spacing $d_3$ can also increase the breakdown voltage between the p-well 64b and the n-well 61a. For example, the third spacing $d_3$ can be in a range of about 6 μm to about 6.5 μm. Other dimensions will be readily determined by one of skill in the art.

A fourth spacing $d_4$ between p-type active area 62a and the boundary of p-well 64a, and between n-type active area 63a and the boundary of n-well 61a, can be selected to increase the breakdown voltage between the p-well 64a and the n-well 61a. As described above with reference to FIG. 2B, a diode corresponding to the fourth diode 29 of FIG. 2A can be formed from the p-well 64a and the n-well 61a. The diode can have a breakdown voltage determined at least partly based on the fourth spacing $d_4$. In certain embodiments, it can be desirable for the breakdown voltage of the diode 29 to be higher than the trigger voltage of the pad protection circuit building block 60, so that current travels from the node $N_1$ to the node $N_2$ through the forward path of conduction $I_{FORWARD}$ for transient electrical events that cause the node $N_1$ to have a positive voltage with respect to node $N_2$. For example, the fourth spacing $d_4$ can be in a range of about 1.5 μm to about 4 μm. Other dimensions will be readily determined by one of skill in the art.

With reference to FIGS. 3A-3B, the pad protection circuit 60 can include a distance $d_5$ corresponding to the width of the n-well 61b, a distance $d_6$ corresponding to the width of the n-type active areas 63b, 63d, a spacing $d_7$ between the n-type active area 63b and the n-well 61b, and a spacing $d_8$ between the p-type active area 62c and the p-well 64b. Furthermore, the pad protection circuit building block 60 can include a distance $d_9$ corresponding to a width of the n-type active area 63a, and a distance $d_{10}$ corresponding to a width of the p-type active area 62a. Additionally, the pad protection circuit building block 60 can further include a distance $d_{11}$ corresponding to the width of the n-type active area 63c, a distance $d_{12}$ corresponding to the height of the n-type active areas 63b-63d, a distance $d_{13}$ corresponding to the pitch height between active areas of neighboring n-type active areas 63b, 63d and a distance $d_{14}$ corresponding to the height of the p-wells 64b, 64d. For example, the distances $d_5$-$d_{14}$ can be as shown in Table 1 below. Other dimensions will be readily determined by one of skill in the art.

TABLE 1

| | Distance |
|---|---|
| $d_5$ | ranging between about 15 μm to about 40 μm |
| $d_6$ | ranging between about 0.6 μm to about 1.0 μm |
| $d_7$ | ranging between about 4.0 μm to about 5.0 μm |
| $d_8$ | ranging between about 8.0 μm to about 18.0 μm |
| $d_9$ | ranging between about 1.5 μm to about 2.0 μm |
| $d_{10}$ | ranging between about 1.5 μm to about 2.0 μm |
| $d_{11}$ | ranging between about 1.0 μm to about 2.0 μm |
| $d_{12}$ | ranging between about 0.4 μm to about 0.6 μm |
| $d_{13}$ | ranging between about 0.9 μm to about 1.2 μm |
| $d_{14}$ | ranging between about 50.0 μm to about 150.0 μm |

It can be desirable to decrease the spacings $d_7$, $d_8$ between p-type active area 62c and n-type active area 63b to achieve a smaller layout of the pad protection circuit building block 60. However, decreasing the spacings $d_7$, $d_8$ can lead to the formation of a parasitic NPN bipolar transistor having an emitter, base and collector formed from the n-type active area 63b, the p-well 64b and the n-well 61b, respectively. In order to inhibit the formation of a parasitic NPN bipolar transistor while decreasing the spacings $d_7$, $d_8$ to achieve a compact layout area, the p-type active area 62c can be included to aid in recombining electrons injected into the n-well 61b with holes. In particular, for an NPN bipolar transistor biased in an active region of operation, the flow of charge from the emitter to the collector can be dominated by electrons, rather than holes. The p-type active area 62c can serve as a recombination center for electrons injected into the n-well 61b Likewise, the p-type active area 62b can reduce the number of electrons injected from the n-type active area 63b that reach the n-well 61b before being recombined with holes. This can prevent the formation of the parasitic NPN bipolar device, even when the spacings $d_7$, $d_8$ are selected to be relatively short. For example, in reference to Table 1, the spacings $d_7$, $d_8$ can be in a range of about 8 μm to about 18 and 4 to about 5 respectively. Other dimensions will be readily determined by one of skill in the art.

Furthermore, the inclusion of the p-type active areas 62b-62d can enhance the flow of holes from node $N_1$ to node $N_2$ along the forward conduction path $I_{FORWARD}$. This can enhance the operation of the PNP bipolar transistor formed from the p-type active area 62c, n-well 61b, and p-well 64b, which can together correspond to the PNP bipolar transistor 22 of FIG. 2A. By enhancing the flow of holes in the PNP bipolar transistor device, the speed at which the pad protection circuit building block 60 triggers can be enhanced relative to a device in which turn-on is dependent on both PNP and NPN bipolar transistor devices.

Figure 3C:
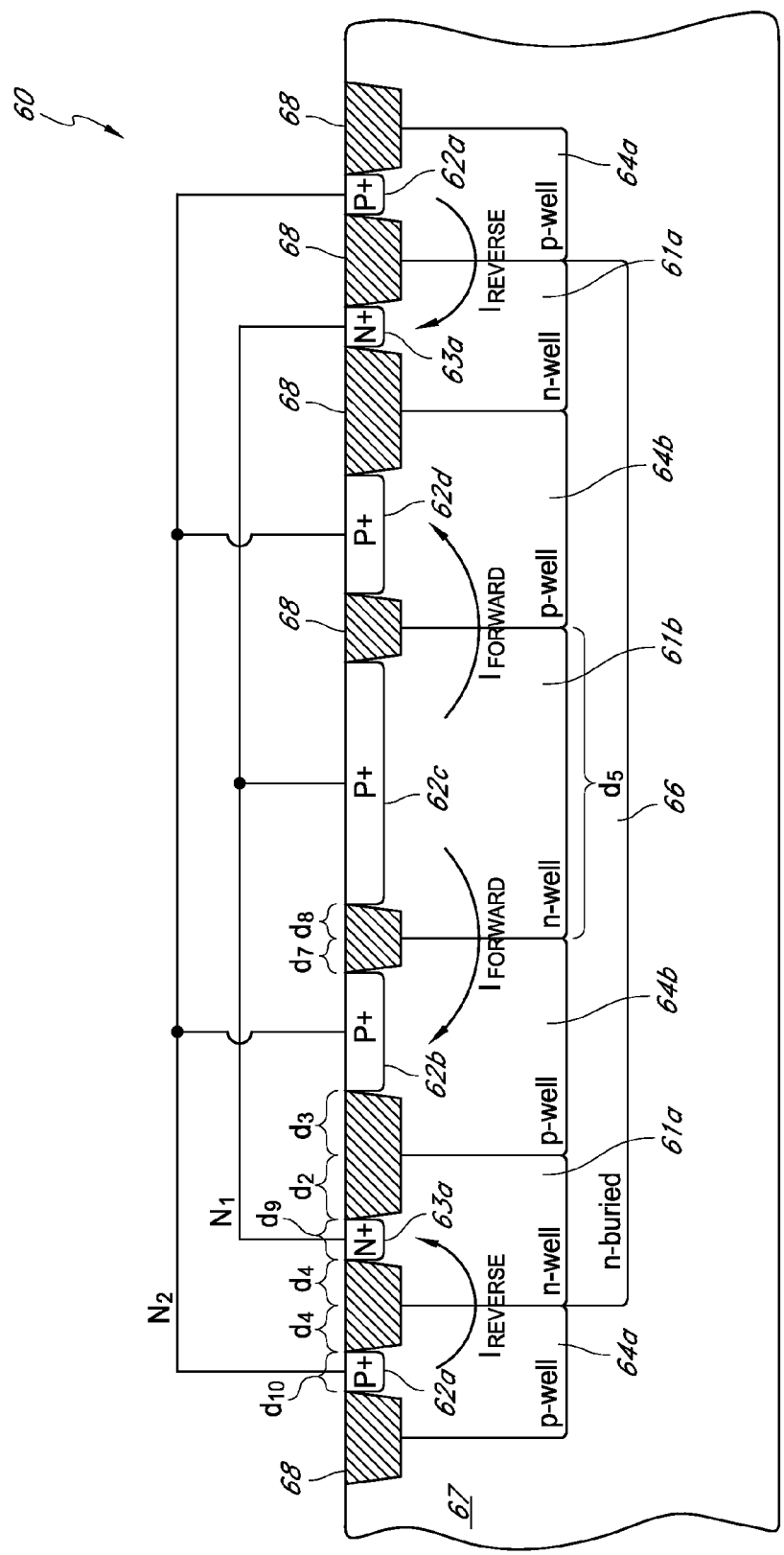
FIG. 3C is a cross section of the IC protection circuit building block of FIG. 3A, taken along the line 3C-3C.

FIG. 3C is a cross section of the pad protection circuit building block 60 of FIG. 3A, taken along the line 3C-3C. The pad protection circuit building block 60 includes the substrate 67, p-wells 64a, 64b, n-wells 61a, 61b, n-type buried layer 66, p-type active areas 62a-62d, n-type active areas 63a, and shallow trench isolation regions 68. The cross-section of FIG. 3B can correspond to a cross-section of the second row 72. In contrast to the cross section of the pad protection circuit building block 60 of FIG. 3B, the cross section of the pad protection building block 60 of FIG. 3C does not include the n-type active areas 63b-63d.

With reference to FIGS. 3A-3C, the p-type active areas 62b-62d can have an increased area along the line 3C-3C relative to the line 3B-3B. For example, as can be seen in FIGS. 3A-3C, the p-type active areas 62b, 62c and 62d can surround the n-type active areas 63b, 63c and 63d, respectively. For example, the p-type active areas 62b, 62d can partially surround the n-type active areas 63b, 63d, respectively, on three sides, while the p-type active area 62c can surround the n-type active area 63c on four sides. This can inhibit the formation of an NPN cross-coupled bipolar structure from the n-type active area 63b, the p-well 64b, and the n-well 61b, which can increase the holding voltage of the pad protection circuit building block 60, as was described earlier. Moreover, this configuration can increase the area of the p-type active areas 62b-62d, which can stimulate the flow of holes from the emitter to the collector of the PNP bipolar transistor formed from the p-type active area 62c, the n-well 61b, and the p-well 64b, thereby improving the turn-on speed of the pad protection circuit building block 60.

In FIGS. 3B and 3C, the n-type active areas 63a-63c and p-type active areas 62a-62d are shown as being separated by the shallow trench isolation regions 68. Providing the shallow trench isolation regions 68 can reduce static current leakage between active areas connected to different electrical nodes and can enhance control of resistance. For example, with reference to FIG. 2A, using shallow trench isolation regions can be used to control the resistance of the resistors 23, 25. Formation of the shallow trench isolation regions 68 can involve etching trenches in the substrate 67, and filling the trenches with a dielectric, such as silicon dioxide, and removing the excess dielectric using any suitable method, such as chemical-mechanical planarization. Persons of ordinary skill in the art will appreciate that shallow trench isolation can be replaced with other methods of reducing leakage, including, but not limited to, those described below with reference to FIGS. 4A and 4B.

Figure 4A:
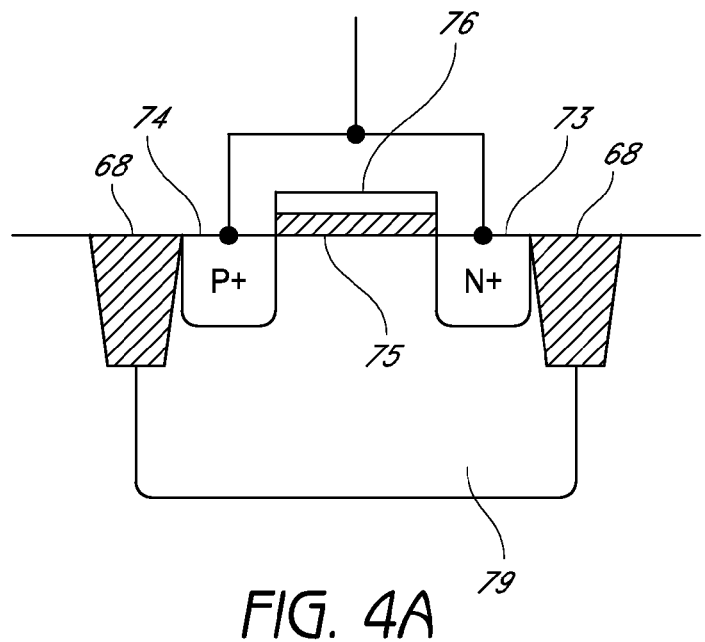
FIG. 4A is a partial cross section of an IC protection circuit building block in accordance with another embodiment.

FIG. 4A is a partial cross section of a pad protection circuit building block in accordance with another embodiment. The cross-section includes shallow trench isolation regions 68, a p-type active area 74, an n-type active area 73, a well 79, a gate oxide layer 75, and a gate 76. The gate 76 is formed above the well 79, and the gate oxide 75 is disposed between the gate 76 and the well 79. The p-type active area 74 and n-type active area 73 are formed in the well 79, on opposite sides of the gate 76.

As shown in FIG. 4A, the gate 76 and the gate oxide 75 can be used as a barrier to form separate n-type and p-type active areas 73, 74, rather than employing shallow trench isolation. The illustrated technique for separating p-type active area 74 from n-type active area 73 can be used to separate, for example, the p-type active area 62b from the n-type active area 63b, the p-type active area 62d from the n-type active area 63d, and/or the p-type active area 62c from the n-type active area 63c of FIGS. 3A-3C. The gate 76 can be electrically connected to the n-type and p-type active areas 73, 74, or to another node. Alternatively, the gate 76 can be left floating so as to avoid limiting the operating voltage of the device by gate breakdown between the gate 76 and the well 79.

Figure 4B:
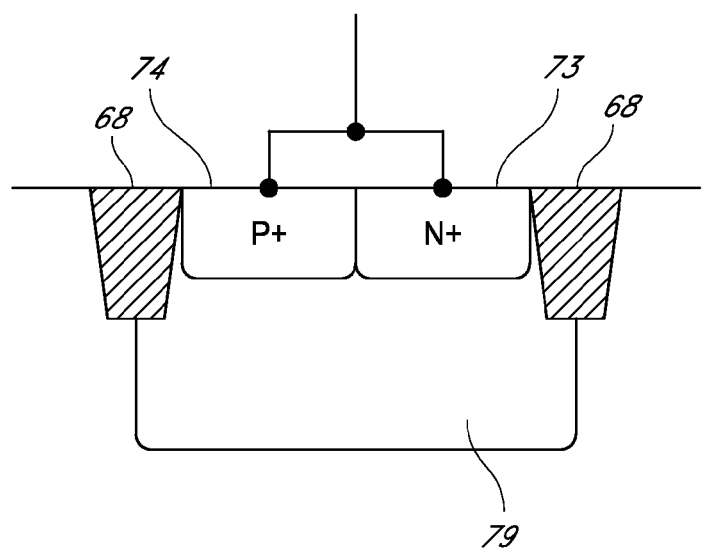
FIG. 4B is a partial cross section of an IC protection circuit building block in accordance with yet another embodiment.

FIG. 4B is a partial cross section of a pad protection circuit building block in accordance with yet another embodiment. The cross-section includes shallow trench isolation regions 68, a p-type active area 74, an n-type active area 73, and a well 79. The p-type active area 74 and n-type active area 73 are formed in the well 79, and are in electrical contact using, for example, silicide. As shown in FIG. 4B, the n-type and p-type active areas 73, 74 can abut each other rather than employing shallow trench isolation therebetween. The illustrated technique for the p-type active area 74 and n-type active area 73 can be used for, for example, the p-type active area 62b and the n-type active area 63b, the p-type active area 62d and the n-type active area 63d, and/or the p-type active area 62c and the n-type active area 63c of FIGS. 3A-3C. This method can be advantageously used to reduce the value of resistors 23, 25, and to reduce the area of the pad protection circuit building block 60.

Although FIGS. 4A-4B show certain schemes for forming adjacent p-type and n-type active areas, persons of ordinary skill in the art will appreciate that other methods can be used. For example, other suitable techniques, such as deep trench isolation, can be employed.

Figure 5A:
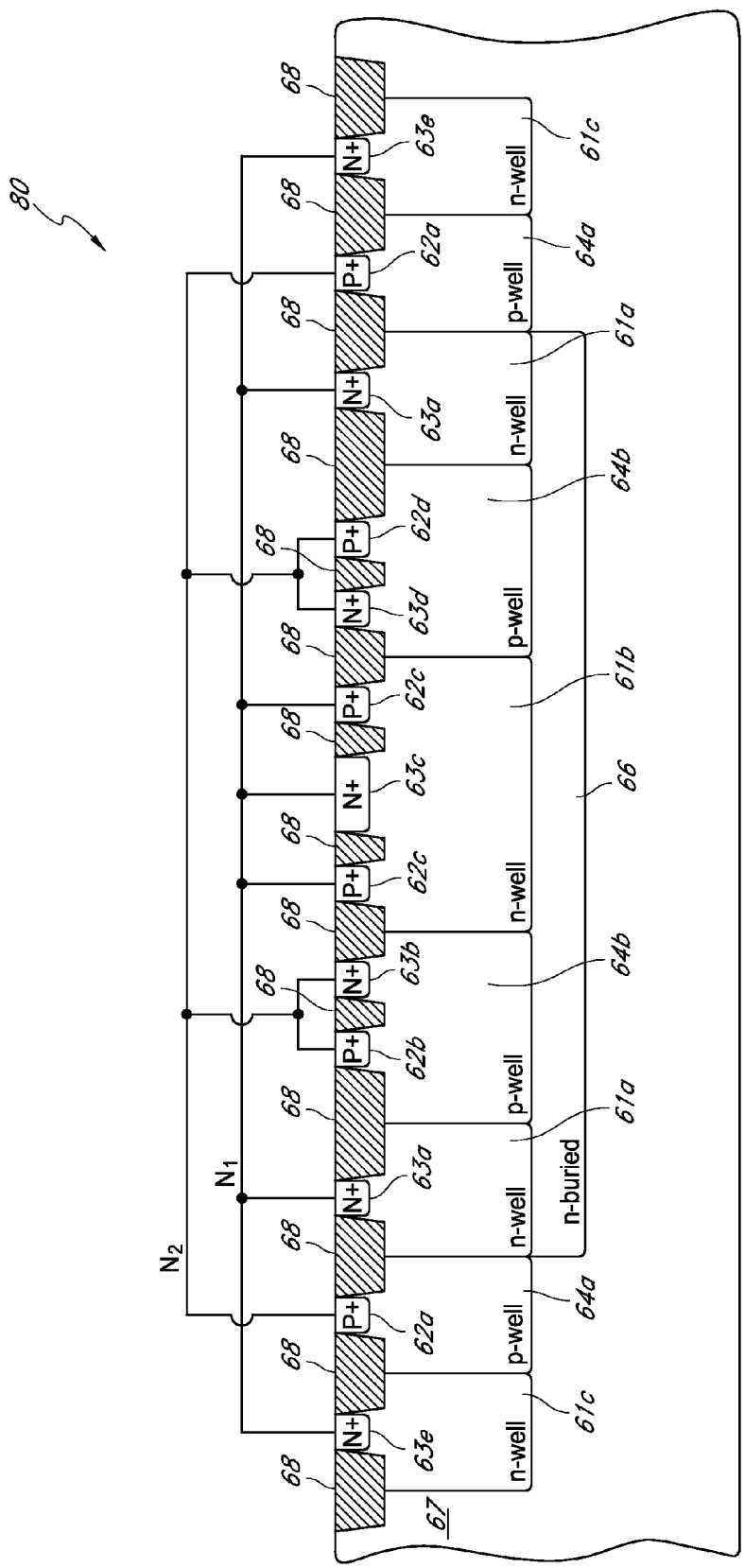
FIG. 5A is a cross section of an IC protection circuit building block in accordance with another embodiment.

FIG. 5A is a cross section of a pad protection circuit building block according to yet another embodiment. The illustrated pad protection circuit building block 80 includes a substrate 67, p-wells 64a, 64b, n-wells 61a-61c, an n-type buried layer 66, p-type active areas 62a-62d, n-type active areas 63a-63e, and shallow trench isolation regions 68. The pad protection circuit building block 80 can be similar to the pad protection circuit building block 60 shown above with reference to FIG. 3B, and can additionally include the n-well 61c and n-type active area 63e formed adjacent to the p-well 64a.

Inclusion of the n-well 61c and the n-type active area 63e can be used to provide an n-type isolation ring around the pad protection circuit building block 80. For enhancing high voltage isolation, the isolation ring can surround the pad protection circuit building block 80 and can reduce noise injected from the pad protection circuit building block 80 into the substrate 67 during a transient electrical event. Additionally, the isolation ring can eliminate the formation of unintended parasitic paths when the pad protection circuit building block 80 is integrated on-chip, thereby providing enhanced robustness against latch-up. Inclusion of the n-well 61c increases the area of the cathode of the reverse conduction path diode to further reduce the on-state resistance of the pad protection circuit in reverse, thereby enhancing the "Z"-type current versus voltage characteristic response of the device. The n-type active area 63e can also increase the reverse breakdown voltage of the diode formed between the p-well 64a and the n-well 61a to the outside of the device, which can aid in keeping the reverse breakdown voltage of the diode above the trigger voltage of the pad protection circuit building block 80 associated with the forward conduction path $I_{FORWARD}$.

Figure 5B:
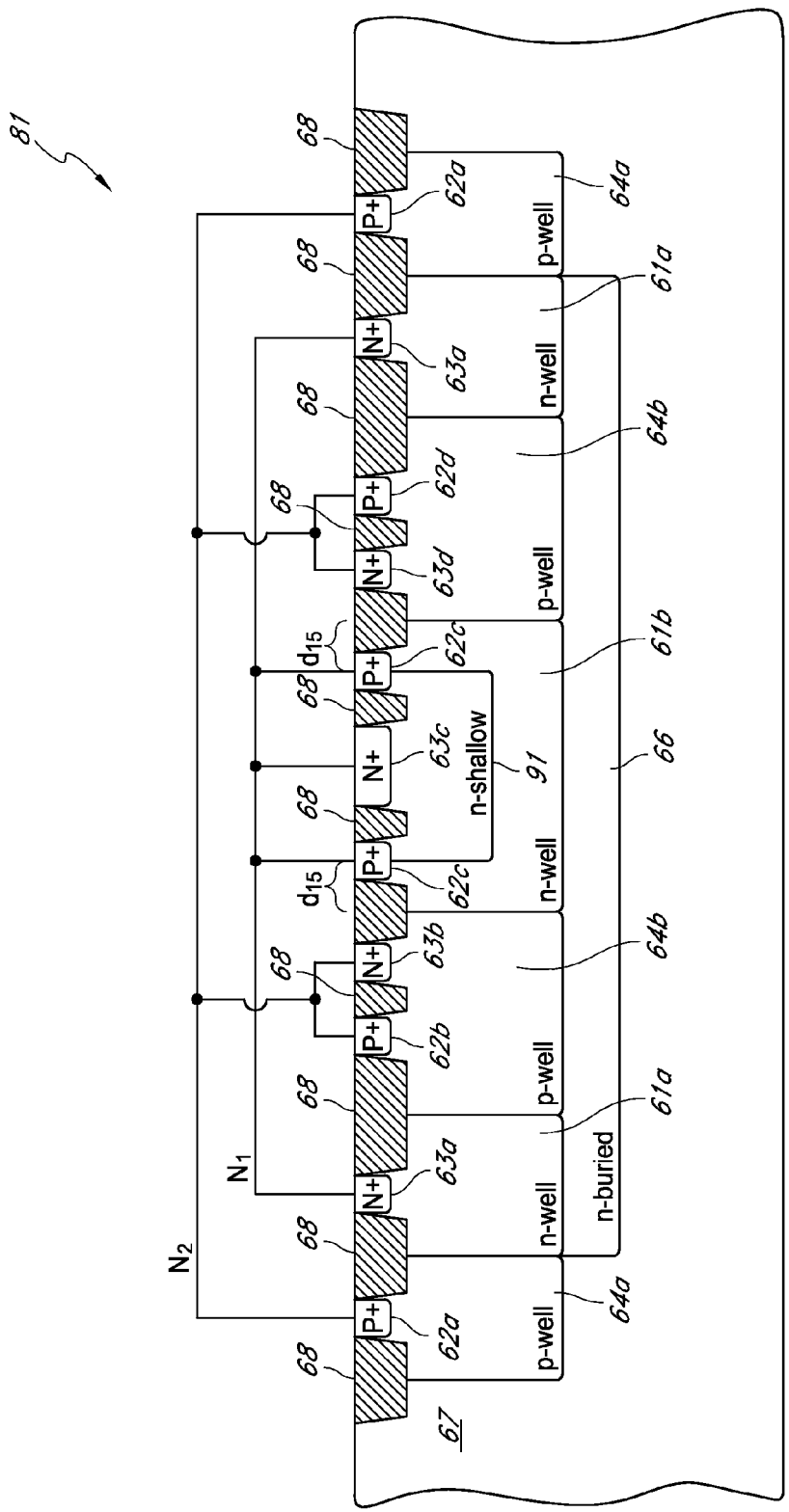
FIG. 5B is a cross section of an IC protection circuit building block in accordance with yet another embodiment.

FIG. 5B is a cross section of a pad protection circuit building block according to yet another embodiment. The illustrated pad protection circuit building block 81 includes a substrate 67, p-wells 64a, 64b, n-wells 61a, 61b, an n-type buried layer 66, p-type active areas 62a-62d, n-type active areas 63a-63d, shallow trench isolation regions 68, and a shallow n-well 91. The pad protection circuit building block 81 can be similar to the pad protection circuit building block 60 shown above with reference to FIG. 3B, and can additionally include the shallow n-well 91 disposed beneath the n-type active area 63c.

Inclusion of the shallow n-well 91 can aid in controlling the surface conductivity of the n-well 61b. The n-well 61b can serve as the base of the PNP bipolar transistor 22 of FIG. 2A, and the shallow n-well 91 can reduce the resistance of the base of the PNP bipolar transistor and the resistance of the first resistor 23 of FIG. 2A. Additionally, the shallow n-well 91 can increase recombination in the n-well 61b. Thus, inclusion of the shallow n-well 91 can be used to reduce the common-emitter gain or "β" of the PNP bipolar transistor 22 of FIG. 2A, thereby permitting enhanced control over the trigger voltage of the pad protection circuit building block 81. The shallow n-well 91 can also increase the response time of the PNP bipolar transistor 22, which can reduce voltage overshoot on the node $N_1$ during a transient electrical event.

The shallow n-well 91 can have edges formed in the n-well 61b, and can be spaced from a boundary of the n-well 61b and the p-well 64b by a spacing $d_{15}$. For example, the spacing $d_{15}$ can range between about 0 µm to about 2.0 µm. Alternatively, the shallow n-well 91 can have edges extending into the p-well 64b, and can be spaced from the boundary of the boundary of the n-well 61b and p-well 64b by a distance ranging between about 0 µm and about 1.5 µm. Other dimensions will be readily determined by one of skill in the art.

The shallow n-well 91 can affect the breakdown voltage of the avalanche breakdown diodes formed between p-well 64b and n-well 61b. For example, as the edges of the shallow n-well 91 are brought closer to the boundary between the p-well 64b and n-well 61b, such as within about 1.5 µm to about 2.0 the breakdown voltage can shift from a first breakdown voltage associated with the breakdown of the n-well 61b/n-buried layer 66 and the p-well 64b to a second breakdown voltage associated with the breakdown of p-well 64b and the shallow n-well 91. Thus, the shallow n-well 91 can be employed to control the breakdown voltage of the pad protection circuit building block 81.

Figure 5C:
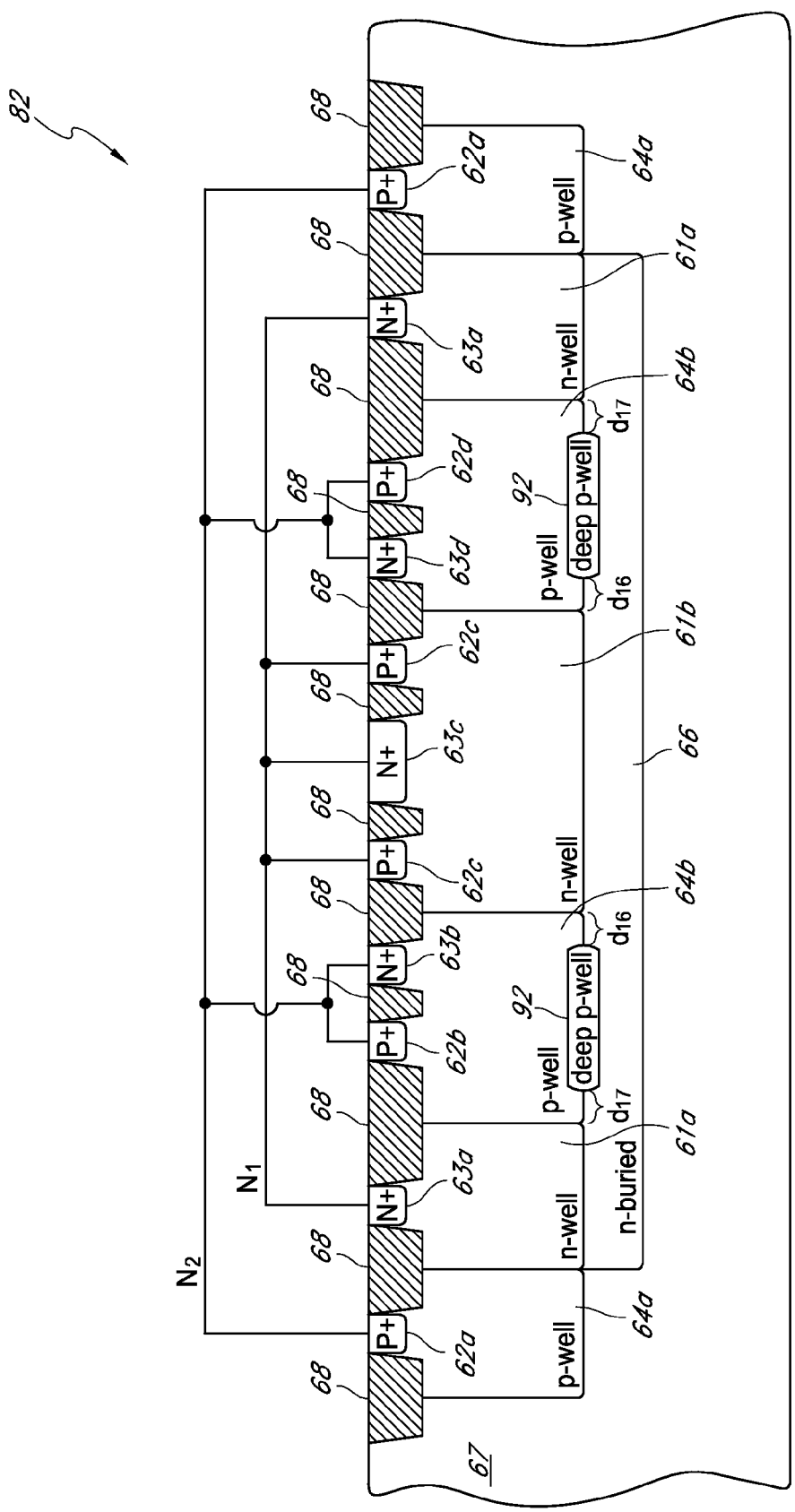
FIG. 5C is a cross section of an IC protection circuit building block in accordance with yet another embodiment.

FIG. 5C is a cross section of a pad protection circuit building block according to yet another embodiment. The illustrated pad protection circuit building block 82 includes a substrate 67, p-wells 64a, 64b, n-wells 61a, 61b, an n-type buried layer 66, p-type active areas 62a-62d, n-type active areas 63a-63d, shallow trench isolation regions 68, and a deep p-well 92. The pad protection circuit building block 82 can be similar to the pad protection circuit building block 60 shown above with reference to FIG. 3B, and can additionally include the deep p-well 92.

Inclusion of the deep p-well 92 can create a localized high doping concentration below the p-well 64b, which can improve heat dissipation in the substrate 67 during a transient electrical event. The deep p-well 92 can also create a high blocking junction path $I_{FORWARD}$ deeper in the substrate 67 relative to the forward conduction path of FIG. 3B, which can be relatively localized near the surface of the p-well 64b. For example, the pad protection circuit building block 82 can have a breakdown voltage associated with the breakdown of the deep p-well 92 and the n-buried layer 66. Thus, inclusion of the deep p-well 92 can aid in controlling the breakdown voltage of the pad protection circuit building block 82, which can help in controlling breakdown across process variation. Additionally, since silicide and metals can be located near the surface of the substrate 67 and can have a lower melting point than the substrate 67, inclusion of the deep p-well 92 can further reduce the risk of integrated circuit failure due to overheating. The deep p-well 92 can be spaced from the n-well 61b by a spacing $d_{16}$ and from the n-well 61a by a spacing $d_{17}$. For example, the spacing $d_{16}$ can range between about 0.0 µm to about 1.5 µm, and the spacing $d_{17}$ can range between about 2.0 µm to about 6.0 µm. Other dimensions will be readily determined by one of skill in the art.

Figure 5D:
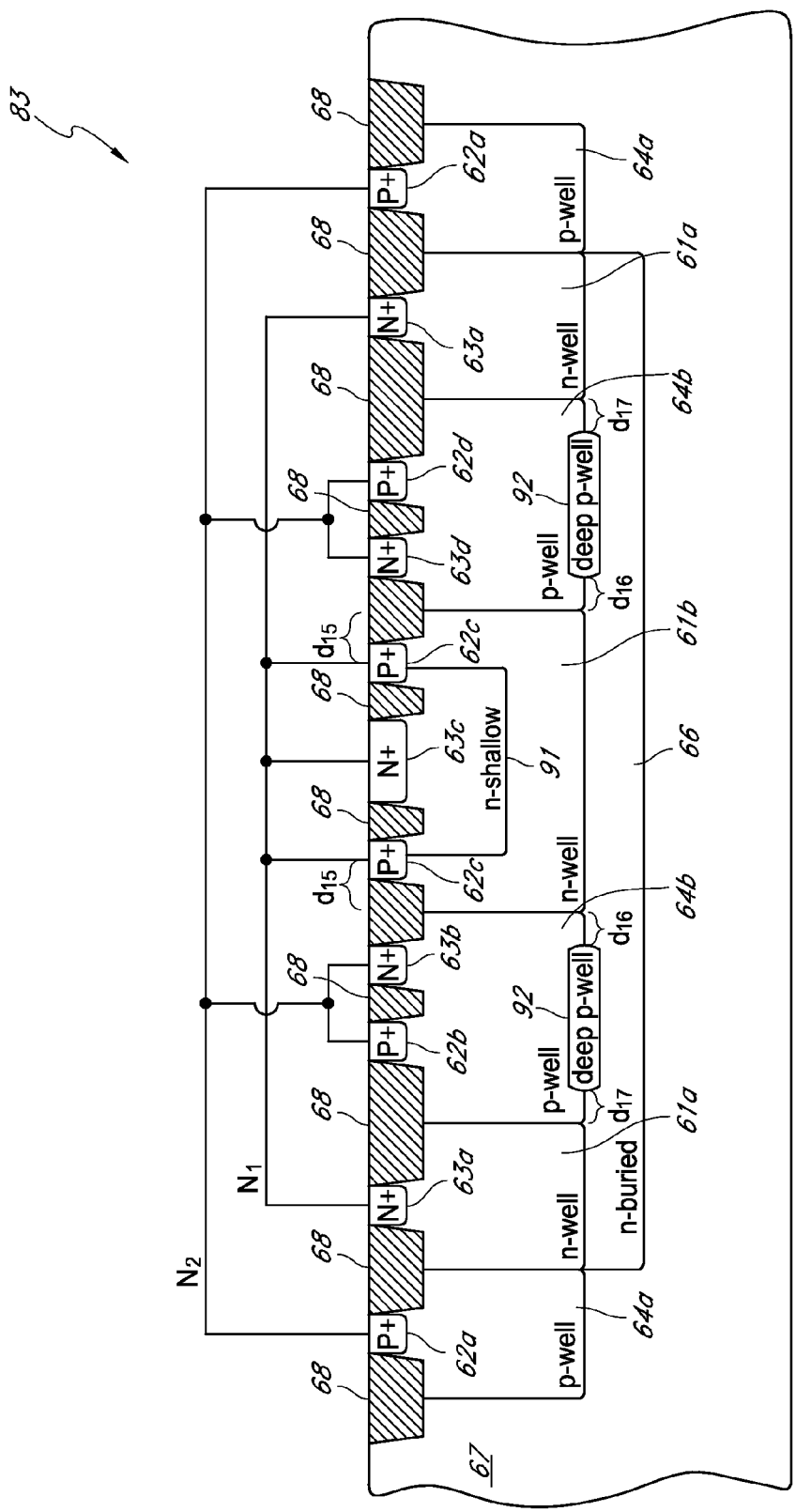
FIG. 5D is a cross section of an IC protection circuit building block in accordance with yet another embodiment.

FIG. 5D is a cross section of a pad protection circuit building block according to still yet another embodiment. The illustrated pad protection circuit building block 83 includes a substrate 67, p-wells 64a, 64b, n-wells 61a, 61b, an n-type buried layer 66, p-type active areas 62a-62d, n-type active areas 63a-63d, shallow trench isolation regions 68, a shallow n-well 91, and a deep p-well 92. The pad protection circuit building block 83 can be similar to the pad protection circuit building blocks 81, 82 described above with reference to FIG. 3B. Inclusion of both the shallow n-well 91 can reduce the resistance of the n-well 61b and increase recombination in the n-well 61b while improving heat dissipation of the pad protection circuit building block 83, as described above.

When the edges of the shallow n-well 91 are relatively far from the boundary between the p-well 64b and n-well 61b, such as a distance greater than about 2.0 µm, the pad protection circuit building block 83 can have a breakdown voltage associated with the breakdown of the deep p-well 92 and the n-buried layer 66. As the edges of the shallow n-well 91 are brought closer to the boundary between the p-well 64b and n-well 61b, such as within about 1.5 µm to about 2.0 µm, the breakdown voltage can be based on a combined effect of breakdown between the n-buried layer 66 and the p-well 64b and the breakdown between the p-well 64b and the shallow n-well 91.

The spacings $d_{15}$-$d_{17}$ can be as described above.

Figure 5E:
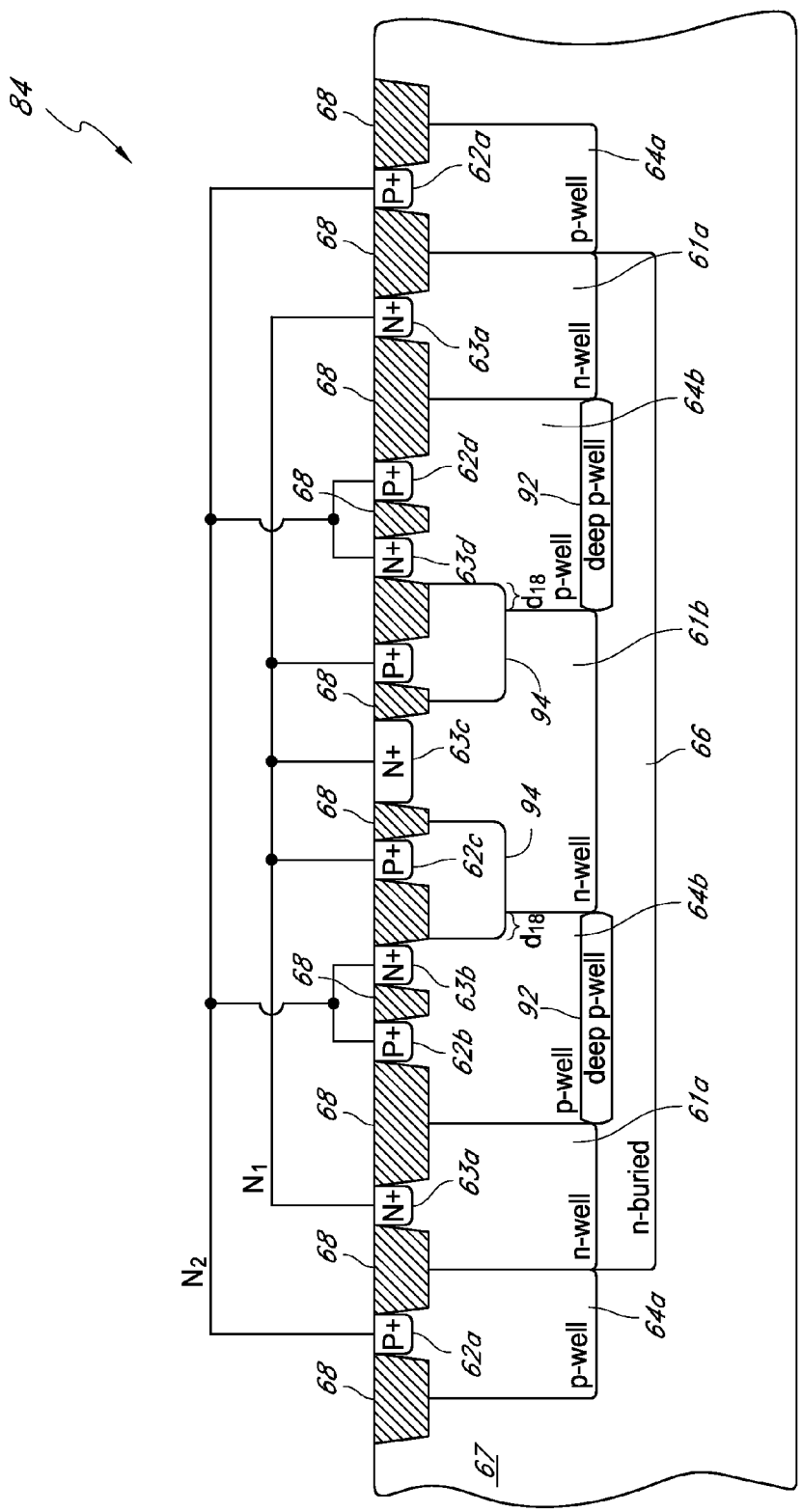
FIG. 5E is a cross section of an IC protection circuit building block in accordance with yet another embodiment.

FIG. 5E is a cross section of a pad protection circuit building block according to still yet another embodiment. The illustrated pad protection circuit building block 84 includes a substrate 67, p-wells 64a, 64b, n-wells 61a, 61b, an n-type buried layer 66, p-type active areas 62a-62d, n-type active areas 63a-63d, shallow trench isolation regions 68, a shallow n-well 94, and a deep p-well 92. The pad protection circuit building block 84 can be similar to the pad protection circuit building block 82 described above with reference to FIG. 5C, and can additionally include the shallow n-well 94 positioned below the p-type active area 62c.

Inclusion of the shallow n-well 94 in this configuration can define a breakdown mechanism between the p-type active area 62c and the p-well 64b. This breakdown mechanism can reduce the trigger voltage of the pad protection circuit building block 84, while still retaining the numerous advantages described above. By selectively reducing the breakdown voltage in this manner, the pad protection circuit building block 84 can be employed in applications using a relatively lower operating voltage. Additionally, the deep p-well 92 can aid in enhancing conduction capability at increased voltages in which the junction between the deep p-well 92 and the n-buried layer 66 is activated.

As shown in FIG. 5E, the shallow-n-well can be formed in the p-well 64b and the n-well 61b, and the shallow n-well can be spaced from the boundary of the p-well 64b and the n-well 61b by a spacing $d_{18}$. For example, the spacing $d_{18}$ ranges between about 0.0 µm to about 1.5 µm. Alternatively, the shallow n-well can be entirely formed in the n-well 61b, and can be spaced from the boundary of the p-well 64b and the n-well 61b by a distance ranging between about 0.0 µm to about 2.0 µm. Other dimensions will be readily determined by one of skill in the art.

Figure 6A:
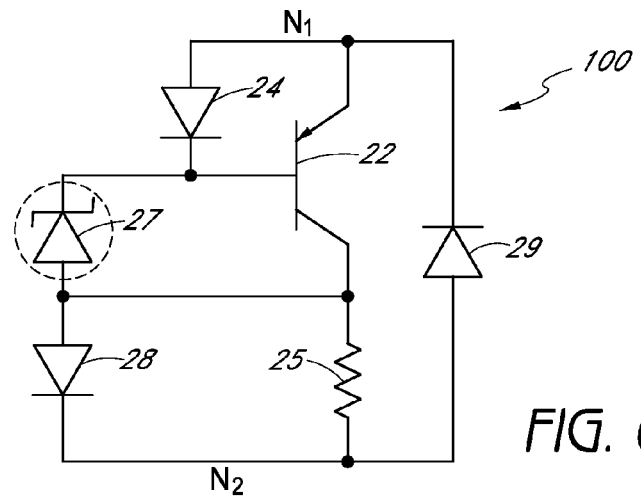
FIG. 6A is a circuit diagram illustrating an IC protection circuit in accordance with another embodiment.

FIG. 6A is a circuit diagram illustrating a pad protection circuit 100 in accordance with another embodiment. The illustrated pad protection circuit 100 includes a resistor 25, a first diode 24, a second diode 27, a third diode 28, a fourth diode 29, and a PNP bipolar transistor 22 having an emitter, a base, and a collector.

The first diode 24 includes an anode electrically connected to the emitter of the PNP bipolar transistor 22 and to a cathode of the fourth diode 29 at a node labeled $N_1$. The first diode 24 further includes a cathode electrically connected to the base of the PNP bipolar transistor 22 and to a cathode of the second diode 27. The second diode 27 further includes an anode electrically connected to the collector of the PNP bipolar transistor 22, to an anode of the third diode 28, and to a first end of the resistor 25. The third diode 28 further includes a cathode electrically connected to a second end of the resistor 25 and to an anode of the fourth diode 29 at a node labeled $N_2$.

The pad protection circuit 100 can be formed, for example, by removing the connection between the node $N_1$ and the n-type active area 43c in FIG. 2B. However, skilled artisans will appreciate that other layout implementations of the pad protection circuit 100 are possible.

In comparison to the pad protection circuit 20 of FIG. 2A, the pad protection circuit 100 of FIG. 6A does not include a resistor between the emitter and the base of the PNP bipolar transistor 22. Removal of this resistor can decrease the trigger voltage of the pad protection circuit 100 by effectively increasing the bipolar current gain and reducing the rate of voltage change over time needed at the node $N_1$ to forward bias the base-emitter junction of the PNP bipolar transistor 22. Thus, the pad protection circuit 100 can be employed in applications using a lower trigger voltage and/or needing a faster transient voltage versus time response.

Figure 6B:
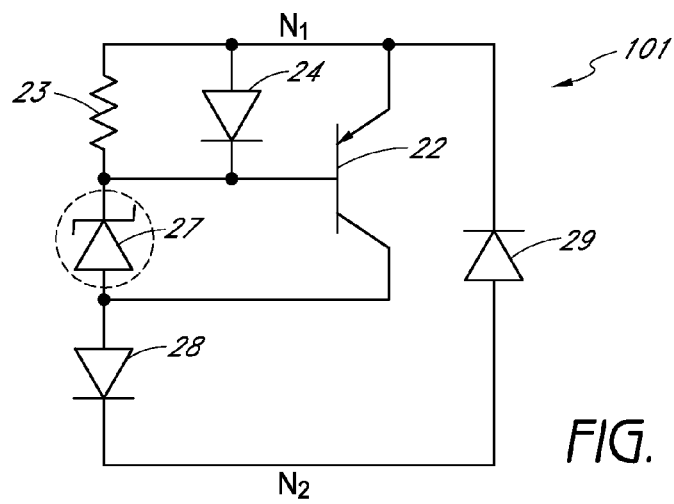
FIG. 6B is a circuit diagram illustrating an IC protection circuit in accordance with yet another embodiment.

FIG. 6B is a circuit diagram illustrating a pad protection circuit 101 in accordance with yet another embodiment. The illustrated pad protection circuit 101 includes a resistor 23, a first diode 24, a second diode 27, a third diode 28, a fourth diode 29, and a PNP bipolar transistor 22 having an emitter, a base, and a collector.

The first diode 24 includes an anode electrically connected to a first end of the resistor 23, to the emitter of the PNP bipolar transistor 22, and to a cathode of the fourth diode 29 at a node labeled $N_1$. The first diode 24 further includes a cathode electrically connected to the base of the PNP bipolar transistor 22, to a second end of the resistor 23 and to a cathode of the second diode 27. The second diode 27 further includes an anode electrically connected to the collector of the PNP bipolar transistor 22 and to an anode of the third diode 28. The third diode 28 further includes a cathode electrically connected to an anode of the fourth diode 29 at a node labeled $N_2$.

The pad protection circuit 101 can be formed, for example, by removing the connection between the node $N_2$ and the p-type active areas 42b, 42e in FIG. 2B. However, skilled artisans will appreciate that other layout implementations of the pad protection circuit 101 are possible.

In comparison with the pad protection circuit 20 of FIG. 2A, the pad protection circuit 101 of FIG. 6B does not include a resistor between the anode and the cathode of the third diode 28. Removal of this resistor can decrease the device capacitance of the pad protection circuit 101 and can reduce the collector current of the bipolar transistor 22 needed to forward-bias the third diode 28 and trigger the protection circuit. Thus, the pad protection circuit 101 can be employed in applications using a lower trigger voltage and/or needing a faster transient voltage versus time response.

Figure 6C:
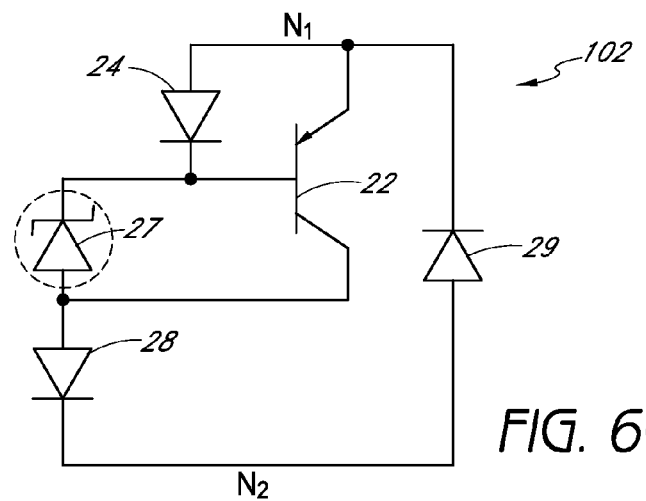
FIG. 6C is a circuit diagram illustrating an IC protection circuit in accordance with still yet another embodiment.

FIG. 6C is a circuit diagram illustrating a pad protection circuit 102 in accordance with still yet another embodiment. The illustrated pad protection circuit 102 includes a first diode 24, a second diode 27, a third diode 28, a fourth diode 29, and a PNP bipolar transistor 22 having an emitter, a base, and a collector.

The first diode 24 includes an anode electrically connected to the emitter of the PNP bipolar transistor 22 and a cathode of the fourth diode 29 at a node labeled $N_1$. The first diode 24 further includes a cathode electrically connected to the base of the PNP bipolar transistor 22 and to a cathode of the second diode 27. The second diode 27 further includes an anode electrically connected to the collector of the PNP bipolar transistor 22 and to an anode of the third diode 28. The third diode 28 further includes a cathode electrically connected to an anode of the fourth diode 29 at a node labeled $N_2$.

The pad protection circuit 102 can be formed, for example, by removing the connection between the node $N_2$ and the p-type active areas 42b, 42e as well as the connection between the node $N_1$ and the n-type active area 43c in FIG. 2B. However, skilled artisans will appreciate that other layout implementations of the pad protection circuit 102 are possible.

In comparison with the pad protection circuit 20 of FIG. 2A, the pad protection circuit 102 of FIG. 6C does not include a resistor between the anode and the cathode of the third diode 28 or a resistor between the emitter and the base of the PNP bipolar transistor 22. Removal of these resistors can decrease trigger voltage of the pad protection circuit 102, as described above with reference to FIG. 6A-6B.

Figure 7:
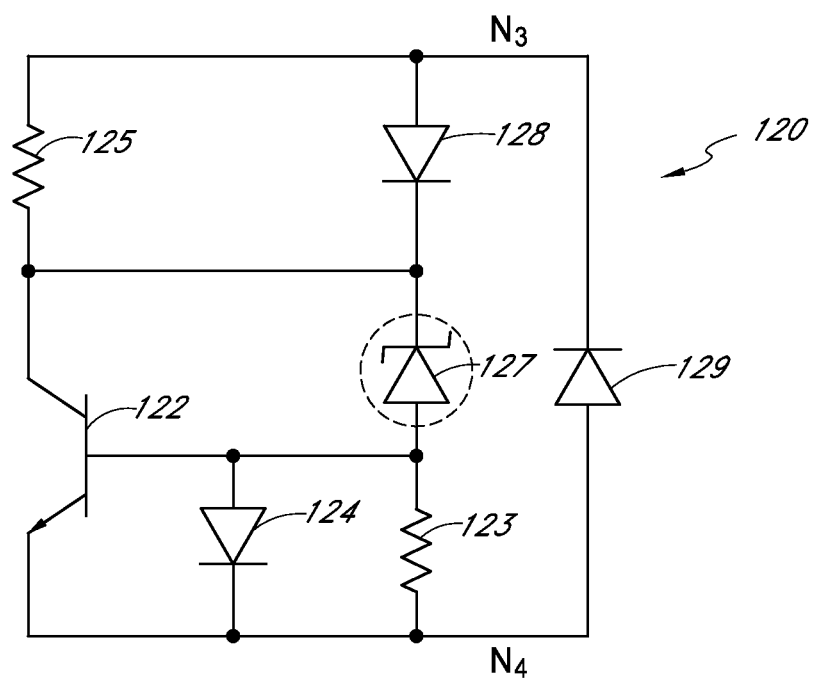
FIG. 7 is a circuit diagram illustrating an IC protection circuit in accordance with still yet another embodiment.

FIG. 7 is a circuit diagram of a pad protection circuit 120 in accordance with still yet another embodiment. The illustrated pad protection circuit 120 includes a first resistor 123, a second resistor 125, a first diode 124, a second diode 127, a third diode 128, a fourth diode 129, and an NPN bipolar transistor 122 having an emitter, a base, and a collector.

The first diode 124 includes a cathode electrically connected to a first end of the first resistor 123, to the emitter of the NPN bipolar transistor 122 and to an anode of the fourth diode 129 at a node labeled $N_4$. The first diode 124 further includes an anode electrically connected to the base of the NPN bipolar transistor 122, to a second end of the first resistor 123 and to an anode of the second diode 127. The second diode 127 further includes a cathode electrically connected to the collector of the NPN bipolar transistor 122, to a cathode of the third diode 128 and to a first end of the second resistor 125. The second diode 127 can be an avalanche breakdown diode. The third diode 128 further includes an anode electrically connected to a second end of the second resistor 125 and to a cathode of the fourth diode 129 at a node labeled $N_3$.

The pad protection circuit can protect an IC from a transient electrical event having either positive or negative voltage amplitude for reasons similar to that described above with reference to FIG. 2A. Additionally, the pad protection circuit 120 can have a "Z"-type current versus voltage characteristic, as set forth earlier. The pad protection circuit 120 is an NPN configuration of the PNP pad protection circuit 20 of FIG. 2A, and can operate in a manner similar to that described earlier. For example, a transient electrical event can cause the voltage of the node $N_3$ to become negative with respect to the voltage of the node $N_4$, which can cause the fourth diode 129 to become forward biased and provide a current path between the nodes $N_3$ and $N_4$.

Likewise, the pad protection circuit 120 can provide protection against a transient electrical event which increases the voltage of the node $N_3$ relative to the voltage of the node $N_4$. As the voltage of the node $N_3$ increases, the reverse bias voltage of the second diode 127 can increase until the second diode 127 reaches a breakdown/avalanche condition in which the second diode 127 can conduct a relatively large breakdown current. For example, the breakdown/avalanche voltage can be in a range of about 15 V to about 80 V. The breakdown current of the second diode 127 can cause a flow of current through the resistor 123, the first diode 124, and the base of the NPN bipolar transistor 122, which can collectively increase the collector current of the NPN bipolar transistor 122. Increasing the voltage across the first resistor 123 can exponentially increase the collector current of the NPN bipolar transistor 122, which can in turn increase the emitter current of the NPN bipolar transistor 122 and the current through the first diode 124. Thus, high conductivity modulation and a low-impedance path can be relatively quickly developed between the node $N_3$ and the node $N_4$ through the third diode 128 and the NPN bipolar transistor 122, which can aid in shunting a portion of the current associated with a transient electrical event while keeping the voltage between node $N_3$ and node $N_4$ relatively high during the on-state operation.

For example, the first resistor 123 can have a resistance ranging between about 90Ω to about 300Ω, and the second resistor 125 can have a resistance ranging between about 80Ω to about 600Ω. Other dimensions will be readily determined by one of skill in the art. Additional details of the first and second resistors 123, 125 can be similar to those described earlier with respect to first and second resistors 23, 25.

Skilled artisans will appreciate that the pad protection circuit 120 of FIG. 7 is an NPN configuration of the PNP pad protection circuit 20 of FIG. 2A. The pad protection circuit 120 can be modified to achieve complementary and electron-driven NPN pad protection circuit configurations corresponding to the hole-driven PNP pad protection circuits 100-102 illustrated in FIGS. 6A-6C.

Figure 8A:
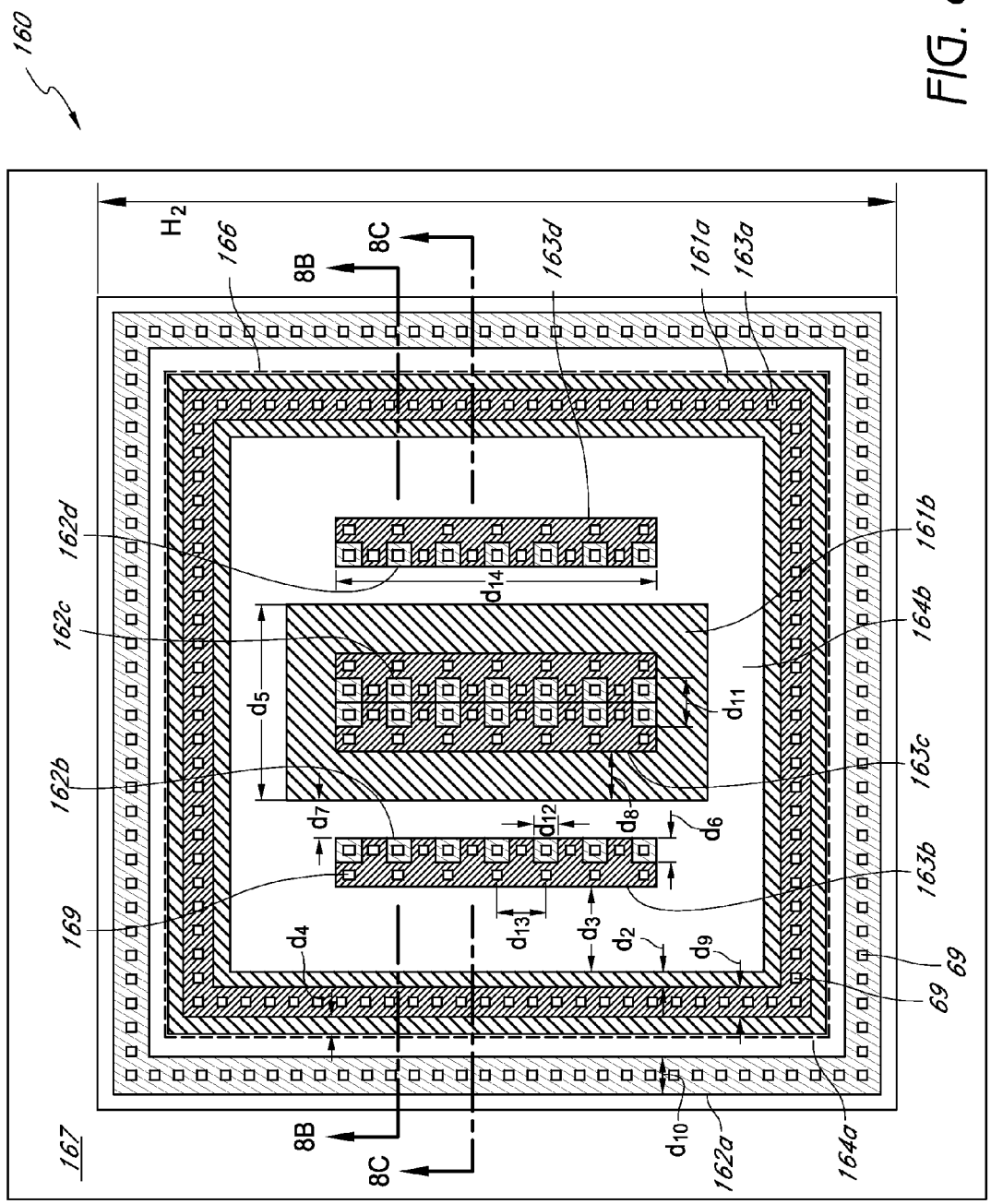
FIG. 8A is a schematic top plan view of an IC protection circuit building block forming the circuit of FIG. 7 in accordance with one embodiment.

FIG. 8A is a top plan view of a pad protection circuit building block that can form the circuit 120 of FIG. 7. The illustrated pad protection circuit building block 160 includes a substrate 167, n-wells 161a, 161b, n-type active areas 163a-163d, p-wells 164a, 164b, p-type active areas 162a-162d, an n-type buried layer 166, and contacts 169.

An NPN bipolar transistor can be formed from n-type active area 163b, p-well 164b, and n-well 161b. The NPN bipolar transistor can correspond to the NPN bipolar transistor 122 of FIG. 7, and can be configured to have a relatively fast turn-on time in response to a transient electrical event.

In order to maintain a high holding voltage of the pad protection circuit building block 160, it can be desirable to prevent the formation of a PNP bipolar transistor from the p-type active area 162c, the n-well 161b, and the p-well 164b. Formation of a PNP bipolar transistor can create a bipolar latch structure having cross-coupled PNP and NPN bipolar transistors and a relatively low holding voltage, as was described earlier.

To inhibit the formation of a PNP bipolar structure and to maintain a high-holding voltage for the pad protection circuit building block 160, the n-type active area 163b can surround p-type active area 162b, the n-type active area 163d can surround p-type active area 162d, and the n-type active area 163c can surround p-type active area 162c. For example, the n-type active areas 163b, 163d can partially surround the p-type active areas 162b, 162d, respectively, on three sides, while the n-type active area 163c can surround the p-type active area 162c on four sides. By surrounding p-type active areas 162b-162d in this manner, recombination of holes can be increased. Additionally, by selecting the area of n-type active area 163b, 163c and 163d to be relatively larger than the p-type active area 162b, 162c and 162d, respectively, the flow of electrons in the pad protection circuit building block 160 can be stimulated. For reasons similar to those described earlier with reference to FIG. 3A, this can result in suppressing the formation of a PNP device, thereby increasing the holding voltage of the pad protection circuit building block 160 and improving the turn-on speed of the pad protection circuit building block 160 by enhancing the carrier mobility and the operation of the NPN device.

The configuration of the pad protection circuit building block 160 can encourage conduction in a lateral direction (parallel to the line 8B-8B when viewed from above) and inhibit breakdown of the pad protection circuit building block 160 in the vertical direction (perpendicular to the line 8B-8B when viewed from above). The size of the NPN bipolar device formed from the n-type active area 163b, p-well 164b, and n-well 161b can be increased by expanding the height $H_2$ of the pad protection circuit building block 160. Additional details of the pad protection circuit building block 160 can be similar to those described earlier with reference to FIG. 3A.

Figure 8B:
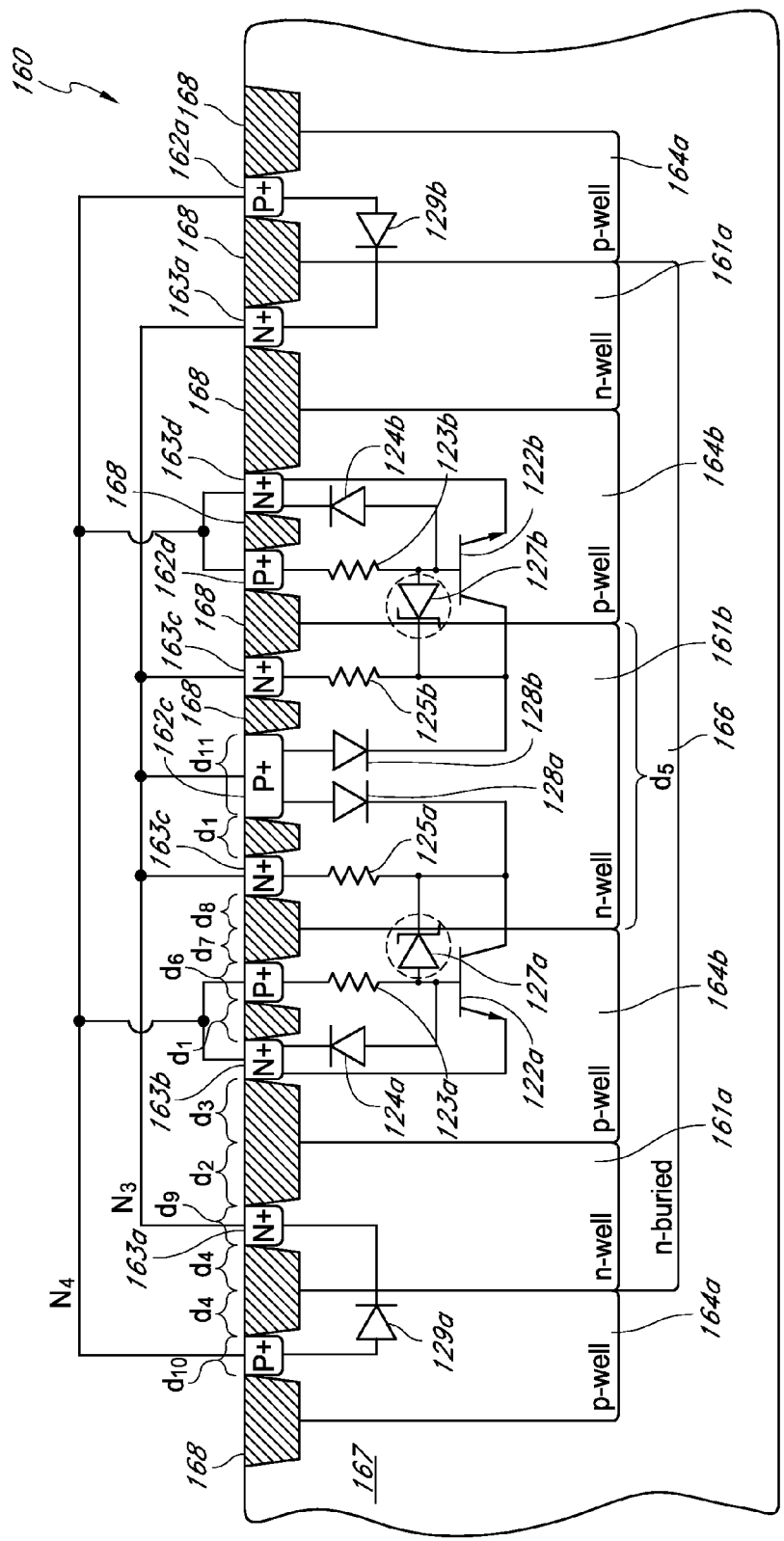
FIG. 8B is a cross section of the IC protection circuit building block of FIG. 8A, taken along the line 8B-8B.

FIG. 8B is a cross section of the pad protection circuit building block 160 of FIG. 8A, taken along the line 8B-8B. The pad protection circuit building block 160 includes a substrate 167, p-wells 164a, 164b, n-wells 161a, 161b, an n-type buried layer 166, p-type active areas 162a-162d, n-type active areas 163a-163d, and shallow trench isolation regions 168. The pad protection circuit building block 160 can undergo back end processing to form contacts and metallization, although these details have been omitted from this figure for clarity. The cross section has been annotated to show certain circuit devices formed from the layout, such as NPN bipolar transistors 122a, 122b, first resistors 123a, 123b, second resistors 125a, 125b, first diodes 124a, 124b, second diodes 127a, 127b, third diodes 128a, 128b, and fourth diodes 129a, 129b. The pad protection circuit building block 160 can form the pad protection circuit 120 of FIG. 7, as will be described below.

The first diodes 124a, 124b can be formed from the p-well 164b and the n-type active areas 163b, 163d. For example, the diode 124a can have an anode formed from the p-well 164b and a cathode formed from the n-type active area 163b, and the diode 124b can have an anode formed from the p-well 164b and a cathode formed from the n-type active area 163d.

The second diodes 127a, 127b can have anodes formed from the p-well 164b and cathodes formed from the n-well 161b. The second diodes 127a, 127b can be avalanche breakdown diodes. For example, the second diodes 127a, 127b can have a breakdown voltage associated with the breakdown of the n-well 161b/n-buried layer 166 and the p-well 164b. In one embodiment, the breakdown voltage of the diodes 127a, 127b can be configured to be higher than a breakdown voltage associated with punch-through of the p-n junctions defined between the p-well 164b and the n-type active area 163b, the p-well 164b and the n-type active area 163d, and the p-type active area 162c and the n-well 161b.

The third diodes 128a, 128b and the fourth diodes 129a, 129b can be formed from the illustrated layout as well. Diodes 128a, 128b can have anodes formed from the p-type active area 162c and cathodes formed form the n-well 161b, and diodes 129a can have anodes formed from the p-well 164a and cathodes formed from the n-well 161a.

The NPN bipolar transistors 122a, 122b can be formed from n-type active areas 163b, 163d, p-well 164b, and n-well 161b. For example, the NPN bipolar transistor 122a can have an emitter formed from the n-type active area 163b, a base formed from the p-well 164b, and a collector formed from the n-well 161b. Likewise, the NPN bipolar transistor 122b can have an emitter formed from the n-type active area 163d, a base formed from the p-well 164b, and a collector formed from the n-well 161b.

The first resistors 123a, 123b can be formed from the resistance between the bases of NPN bipolar transistors 122a, 122b and the p-type active areas 162b, 162d. Likewise, the second resistors 125a, 125b can formed from the resistance between the collectors of NPN bipolar transistors 122a, 122b and the n-type active area 163c.

Persons of ordinary skill in the art will appreciate that the cross-section shown in FIG. 8B can result in the formation of the circuit shown in FIG. 7, for reasons similar to those set forth earlier with reference to FIG. 2A. Thus, FIG. 8B is a cross section of one implementation of the pad protection circuit 120 of FIG. 7. Skilled artisans will appreciate that other layout implementations of the pad protection circuit 120 are possible.

The distances $d_1$-$d_{14}$ can be similar to those described above with reference to those of complementary FIGS. 3A-3B. Although n-type active areas 163a-163d and p-type active areas 162a-162d are shown as being separated by the shallow trench isolation regions 168, any suitable method of separation is possible. Thus, the methods of separating adjacent active areas illustrated in FIGS. 4A-4B can be applied to the pad protection circuit building block 160. Additionally, variations to the pad protection circuit building block 160, such as those shown in FIGS. 5A-5E, can be analogously applied to the pad protection circuit building block 160.

Figure 8C:
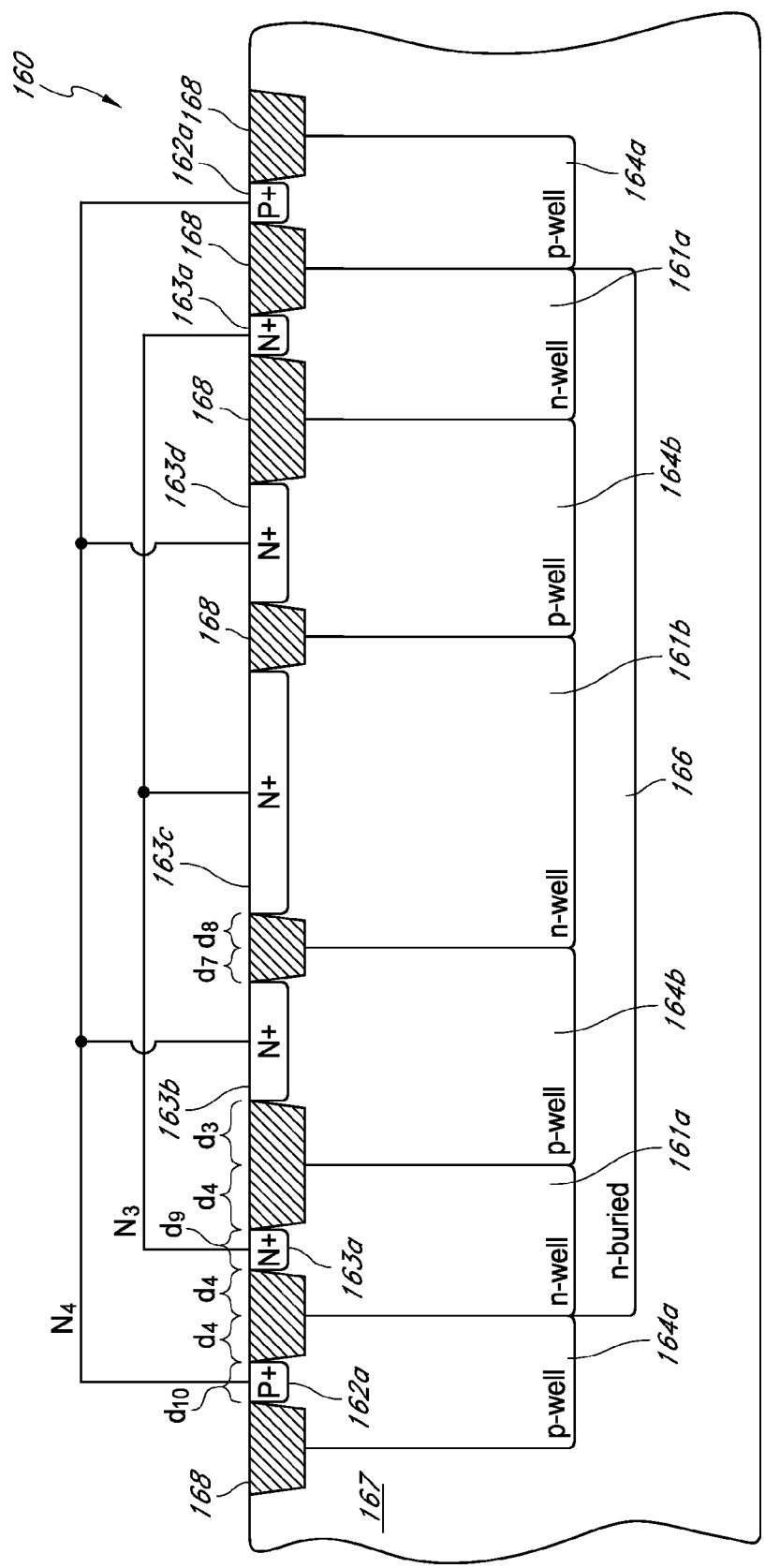
FIG. 8C is a cross section of the IC protection circuit building block of FIG. 8A, taken along the line 8C-8C.

FIG. 8C is a cross section of the pad protection circuit building block 160 of FIG. 8A, taken along the line 8C-8C. The pad protection circuit building block 160 includes the substrate 167, p-wells 164a, 164b, n-wells 161a, 161b, n-type buried layer 166, p-type active area 162a, n-type active areas 163a-163d, and shallow trench isolation regions 168. In contrast to the cross section of the pad protection circuit building block 160 of FIG. 8B, the cross section of the pad protection circuit building block 160 of FIG. 3C does not include p-type active areas 162b-162d.

With reference to FIGS. 8A-8C, the n-type active areas 163b-163d can have an increased area along the line 8C-8C relative to the line 8B-8B. For example, the n-type active areas 163b, 163c and 163d can surround p-type active areas 162b, 162c and 162d, respectively. This can inhibit the formation of a PNP cross-coupled bipolar structure from the p-type active area 162c, the n-well 161b, and the p-well 164b, and encourages further the NPN transistor operation, which can increase the holding voltage and turn-on speed of the pad protection circuit building block 160, as described earlier. Moreover, this approach increases the area of the n-type active areas 163b-163d, which can stimulate the flow of electrons from the emitter to the collector of NPN bipolar transistors 122a, 122b, which can improve the turn-on speed of the pad protection circuit building block 160.

Persons of ordinary skill in the art will recognize that the pad protection circuit 160 can be modified to achieve complementary and electron-driven NPN pad protection circuit configurations corresponding to the hole-driven PNP pad protection circuits illustrated in FIGS. 5A-5E.

Figure 9A:
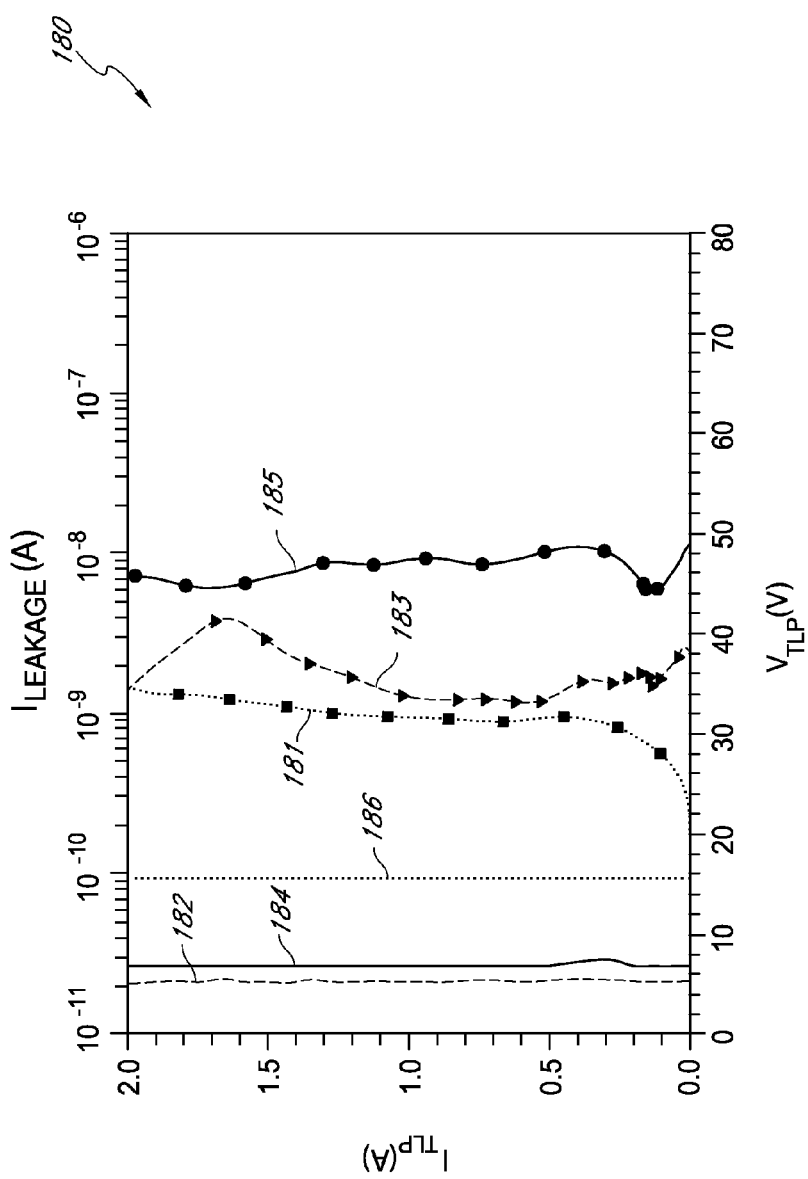
FIG. 9A is a graph of transmission line pulsing (TLP) laboratory data for three examples of pad protection circuits.

FIG. 9A is a graph 180 of transmission line pulsing (TLP) laboratory data for three examples of pad protection circuits. The illustrated graph 180 includes plots 181, 183, and 185 of TLP voltage versus TLP current for three examples of pad protection circuits developed in a 180 nm 40 V Bipolar/CMOS/DMOS (BCD) process. The graph 180 also includes plots 182, 184, 186 of TLP current versus leakage current for the pad protection circuit corresponding to the plots 183, 185, and 181, respectively.

The plots 181, 186 can correspond to the pad protection circuit of FIGS. 3A, 5E, and 6A optimized for about 20 V, but having active areas as shown in FIG. 4B. The plots 183, 182 can correspond to the pad protection circuit of FIGS. 2A, 3A and 5E optimized for about 30 V, but with active areas as shown in FIG. 4B. The plots 185, 184 can correspond to the pad protection circuit of FIGS. 3A-3C optimized for about 40 V, but having active areas as shown in FIG. 4B. The measurements were taken at about room temperature, and each TLP measurement point of the of the plots 181, 183, 185 can correspond to a voltage and a current measurement obtained by forcing a rectangular 100 ns current pulse having about a 200 ps rise time into the pad protection circuit and measuring the voltage of the pad protection circuit between about 40% and about 90% of the current pulse width. The plots 182, 184, 186 correspond to DC leakage at about 24 V, 36 V, and 48 V, respectively, after each TLP current pulse. As skilled artisans will appreciate, a relatively small variation in the leakage current value after each pulse can indicate the integrity of the IC. In contrast, drastic change in the leakage current can indicate IC damage.

As shown in FIG. 9A, the three examples of pad protection circuits can have relatively high holding voltages and turn-on speed. Furthermore, the leakage current of the pad protection circuits can be relatively low and can have a relatively small variation across TLP current. This can indicate the integrity and robustness of the IC using the pad protection circuits after passage of transient electrical events.

The pad protection circuit characteristic response shown in the graph 180 can be different for other configurations of the pad protection circuits. For example, to lower the trigger voltage of the pad protection circuit corresponding to the plot 185, a configuration similar to that shown in FIG. 6B can be used.

Figure 9B:
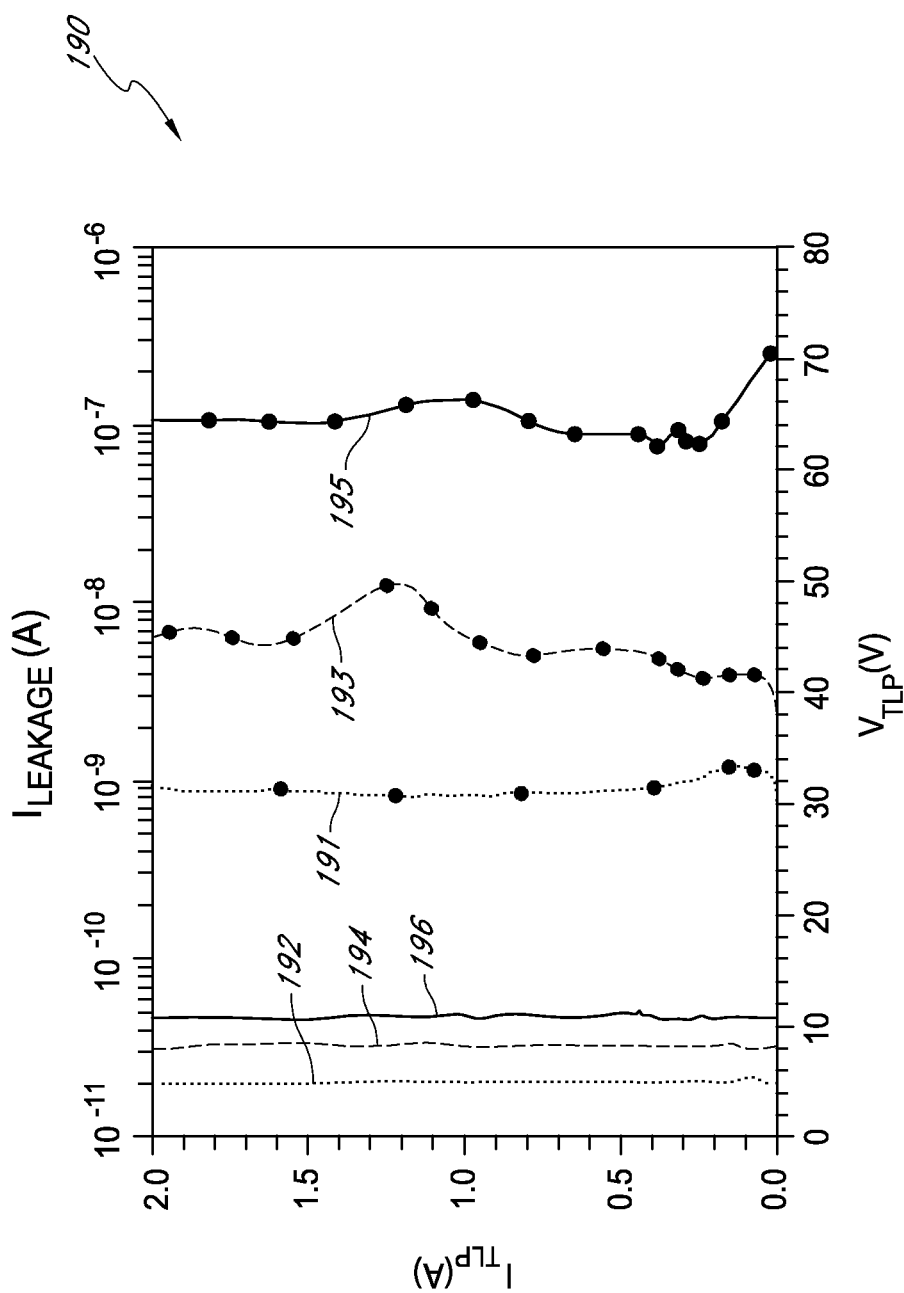
FIG. 9B is a graph of TLP laboratory data for three examples of pad protection circuits.

FIG. 9B is a graph 190 of TLP laboratory data for three examples of pad protection circuits. The illustrated graph 190 includes plots 191, 193, and 195 of TLP voltage versus TLP current for three examples of pad protection circuits developed in a 180 nm 60 V BCD process. The graph 190 also includes plots 192, 194, 196 of TLP current versus leakage current for the pad protection circuit corresponding to the plots 191, 193, and 195, respectively.

The plots 191, 192 can correspond to the pad protection circuit of FIGS. 3A, 5E, and 6A optimized for about 30 V, but having active areas as shown in FIG. 4B. The plots 193, 194 can correspond to the pad protection circuit of FIGS. 3A, 5D and 6A optimized for about 40 V, but with active areas as shown in FIG. 4B. The plots 195, 196 can correspond to the pad protection circuit of FIGS. 2A, 3A, and 5B optimized for about 40 V, but having active areas as shown in FIG. 4B. The measurements were taken at about room temperature, and each TLP measurement point of the of the plots 191, 193, 195 can correspond to a voltage and a current measurement obtained by forcing a rectangular 100 ns current pulse having about a 200 ps rise time into the pad protection circuit and measuring the voltage of the pad protection circuit between about 40% and about 90% of the current pulse width. The plots 192, 194, 196 correspond to DC leakage at about 36 V, 48 V, and 72 V, respectively, after each TLP current pulse.

As shown in FIG. 9B, the three examples of pad protection circuits can have relatively high holding voltages and turn-on speed. Furthermore, the leakage current of the pad protection circuits can be relatively low and can have a relatively small variation across TLP current. This can indicate the integrity and robustness of the IC using the pad protection circuits after passage of transient electrical events. The pad protection circuits were measured to sustain a relatively high bidirectional ratio of stress per unit area, ranging from about 0.21 mA-TLP-/$\mu m^2$ at about 60V to about 0.31 mA-TLP-/$\mu m^2$ at about 20 V.

Figure 9C:
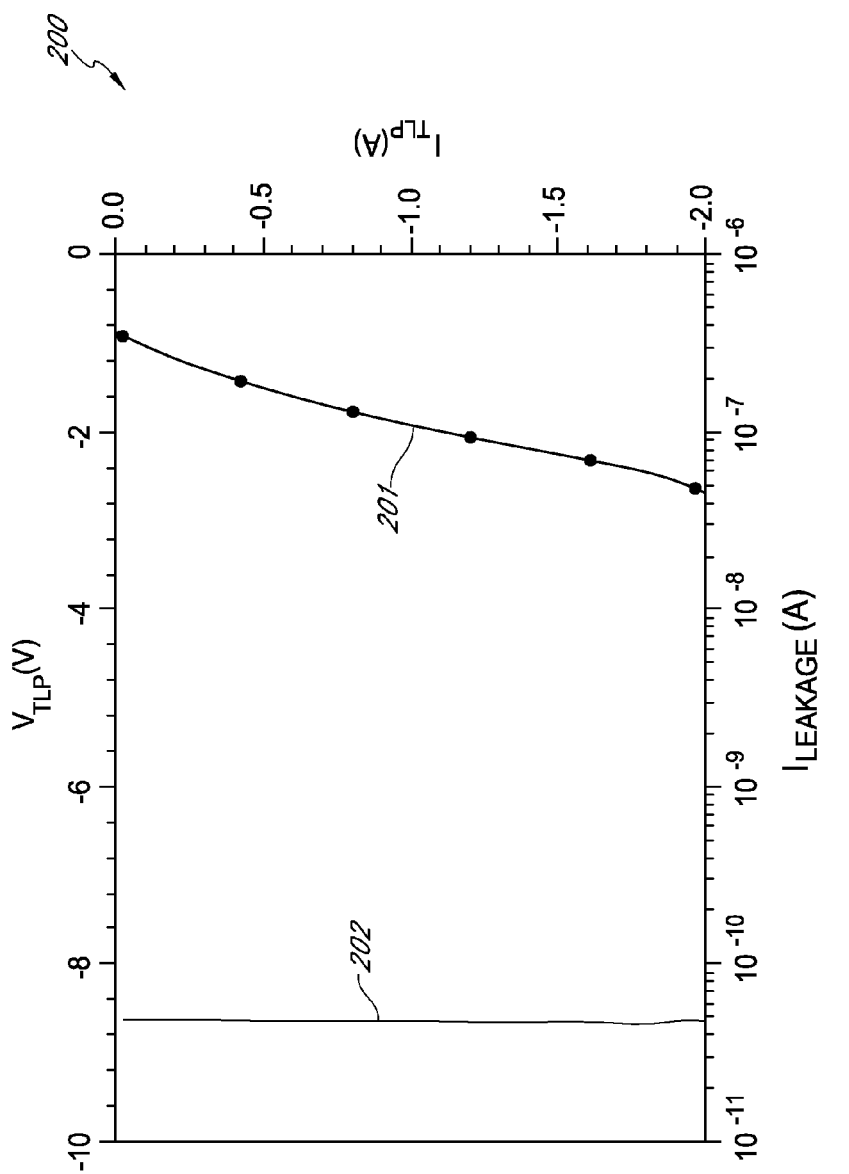
FIG. 9C is a graph of TLP laboratory data for one example of a pad protection circuit.

FIG. 9C is a graph 200 of TLP laboratory data for one examples of a pad protection circuit. The illustrated graph 200 includes plot 201 of TLP voltage versus TLP current and a plot 202 of TLP current versus leakage current for the pad protection circuit corresponding to the plots 195, 196 of FIG. 9B. The graph 200 illustrates operation of the protection circuit in the negative transient voltage direction.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products, including those for industrial, medical and automotive applications.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   an internal circuit electrically connected between a first node and a second node; and
   a protection circuit electrically connected between the first node and the second node, wherein the protection circuit is configured to protect the internal circuit from transient electrical events, the protection circuit comprising:
      a bipolar transistor having an emitter, a base, and a collector, wherein the emitter is connected to the first node, and wherein the base is connected to a third node, and wherein the collector is connected to a fourth node;
      a first diode electrically connected between the third node and the fourth node, wherein the first diode is an avalanche breakdown diode having the same polarity as the base and the collector of the bipolar transistor, respectively, and wherein a breakdown voltage associated with the first diode is lower than or about equal to a breakdown voltage associated with the base and the collector of the bipolar transistor;
      a second diode electrically connected between the second node and the fourth node; and
      a third diode electrically connected between the first node and the third node.

2. The apparatus of claim 1, further comprising a first resistor having a first end electrically connected to the first node and a second end electrically connected to the third node.

3. The apparatus of claim 2, wherein the first resistor has a resistance ranging between about 90Ω to about 560Ω.

4. The apparatus of claim 2, further comprising a second resistor having a first end electrically connected to the second node and a second end electrically connected to the fourth node.

5. The apparatus of claim 4, wherein the second resistor has a resistance ranging between about 110Ω to about 260Ω.

6. The apparatus of claim 1, further comprising a first resistor having a first end electrically connected to the second node and a second end electrically connected to the fourth node.

7. The apparatus of claim 1, wherein the bipolar transistor is a PNP bipolar transistor, and wherein the first diode includes an anode electrically connected to the fourth node and a cathode electrically connected to the third node, and wherein the second diode includes an anode electrically connected to the fourth node and a cathode electrically connected to the second node.

8. The apparatus of claim 7, wherein the bipolar transistor and the first, second and third diodes are configured to protect the internal circuit when a voltage of the first node exceeds a voltage of the second node by a first voltage difference, and wherein the protection circuit further includes a fourth diode having an anode electrically to the second node and a cathode electrically connected to the first node, wherein the fourth diode is configured to protect the internal circuit when a voltage of the first node is below a voltage of the second node by a second voltage difference.

9. The apparatus of claim 1, wherein the internal circuit and the protection circuit are formed on a single integrated circuit.

10. The apparatus of claim 1, wherein the internal circuit and the protection circuit are formed on different integrated circuits.

11. An apparatus, comprising:
    an internal circuit electrically connected between a first node and a second node; and
    a protection circuit electrically connected between the first node and the second node, wherein the protection circuit is configured to protect the internal circuit from transient electrical events, the protection circuit comprising:
       a bipolar transistor having an emitter, a base, and a collector, wherein the emitter is connected to the first node, and wherein the base is connected to a third node, and wherein the collector is connected to a fourth node;
       a first diode electrically connected between the third node and the fourth node, wherein the first diode is an avalanche breakdown diode having the same polarity as the base and the collector of the bipolar transistor, respectively, and wherein a breakdown voltage associated with the first diode is lower than or about equal to a breakdown voltage associated with the base and the collector of the bipolar transistor; and
    a second diode electrically connected between the second node and the fourth node,
    wherein the bipolar transistor is a NPN bipolar transistor, and wherein the first diode includes an anode electrically connected to the third node and a cathode electrically connected to the fourth node, and wherein the second diode includes an anode electrically connected to the second node and a cathode electrically connected to the fourth node.

12. An apparatus for providing protection from transient electrical events, the apparatus comprising:

a substrate;

a first well disposed in the substrate, wherein the well has a doping of a first type;

a first active area disposed in the first well, wherein the first active area has a doping of the first type;

a second active area disposed in the first well, wherein the second active area has a doping of a second type opposite that of the first type; and a second well adjacent the first well, wherein the second well has a doping of the second type, wherein the second active area, the first well, and the second well are configured to operate as a bipolar transistor having an emitter, a base, and a collector, wherein the second active area, the first well, and the second well are configured to operate as the emitter, base, and collector of the bipolar transistor, respectively, and wherein the second active area surrounds at least a portion of the first active area so as to aid in recombining carriers injected into the first well from the second well before the carriers reach the first active area, and wherein the first well and the second well are configured to operate as an avalanche breakdown diode, and wherein an avalanche breakdown voltage between the second well and the first well is lower than or equal to about a breakdown voltage between the second active area and the first well.

13. The apparatus of claim 12, wherein the doping of the first type is n-type and the doping of the second type is p-type, and wherein the carriers are electrons.

14. The apparatus of claim 13, wherein the second active area surrounds the first active area on four sides.

15. The apparatus of claim 13, further comprising a third active area formed in the second well and a fourth active area formed in the second well, wherein the third active area has a doping of the first type and wherein the fourth active area has a doping of the second type, and wherein the fourth active area surrounds at least a portion of the third active area so as to aid in recombining electrons injected into the second well from the fourth active area before the electrons reach the first well.

16. The apparatus of claim 15, wherein the first and second active areas are electrically connected to a first node, and wherein the third active area is electrically connected to a second node.

17. The apparatus of claim 16, further comprising an internal circuit electrically connected between the first and second nodes, wherein the first well, the second well, the second active area, and the fourth active area are configured to protect the internal circuit from transient electrical events.

18. The apparatus of claim 16, wherein the second and third active areas are configured to inhibit the third active area, the second well, and the first well from operating as an NPN bipolar transistor by recombining carriers injected into the first and second wells.

19. The apparatus of claim 13, further including a shallow n-well disposed inside the first well.

20. The apparatus of claim 13, further including a shallow n-well having a first portion disposed inside the first well and a second portion disposed inside the second well.

21. The apparatus of claim 13, further comprising an n-type buried layer disposed beneath the first and second wells.

22. The apparatus of claim 21, further comprising a deep p-well disposed between the n-type buried layer and the second well, and wherein a breakdown voltage between deep p-well and the n-type buried layer is lower than the breakdown voltage between the second well and the first well.

23. The apparatus of claim 22, further comprising a shallow n-well disposed between the first and second wells, wherein a breakdown voltage between the shallow n-well and the second well is lower than the breakdown voltage between the deep p-well and the n-type buried layer and lower than the breakdown voltage between the second well and the first well.

24. The apparatus of claim 13, further comprising a third well surrounding the first and second wells, wherein the third well has an n-type doping, and wherein the third well is configured to operate as a guard ring for the first and second wells.

25. The apparatus of claim 24, further comprising a fourth well surrounding the first, second and third wells, wherein the fourth well has a p-type doping, and wherein the fourth well is configured to operate as an isolation ring for the first, second and third wells.

26. The apparatus of claim 13, wherein the first and second active areas are separated by shallow trench isolation.

27. The apparatus of claim 13, wherein the first and second active areas are abutting to each other.

28. The apparatus of claim 12, wherein the doping of the first type is p-type and the doping of the second type is n-type, and wherein the carriers are holes.

29. A method for providing protection from transient electrical events, the method comprising:

providing a substrate;

forming a first well in the substrate, wherein the first well has a doping of a first type;

forming a second well adjacent the first well, wherein the second well has a doping of a second type opposite that of the first type;

forming a first active area in the first well, wherein the first active area has a doping of the first type; and forming a second active area in the first well, wherein the second active area has a doping of the second type, and wherein forming the second active area comprises surrounding at least a portion of the first active area using the second active area, and wherein the second active area, the first well, and the second well are configured to operate as a bipolar transistor having an emitter, a base, and a collector, and wherein the second active area, the first well, and the second well are configured to operate as the emitter, base, and collector of the bipolar transistor, respectively, and wherein the first well and the second well are configured to operate as an avalanche breakdown diode, and wherein an avalanche breakdown voltage between the second well and the first well is lower than or about equal to a breakdown voltage between the second active area and the first well.

30. The method of claim 29, wherein the doping of the first type is p-type and the doping of the second type is n-type, and wherein the carriers are holes.

31. The method of claim 29, wherein the doping of the first type is n-type and the doping of the second type is p-type, and wherein the carriers are electrons.

32. The method of claim 31, further comprising forming an n-type buried layer in the substrate beneath the first and second wells.

33. The method of claim 29, wherein forming the second active area comprises surrounding the first active area on four sides using the second active area.

34. The method of claim 29, further comprising forming a third active area in the second well and a fourth active area in the second well, wherein the third active area has a doping of the first type and the fourth active area has a doping of the second type, and wherein forming the fourth active area comprises surrounding at least a portion of the third active area using the fourth active area.

35. The method of claim 34, further comprising forming shallow trench isolation between the third active area and the fourth active area.

36. The method of claim 34, wherein forming the third active area in the second well and the fourth active area in the second well comprises forming the third active area and the fourth active areas so that they are abutting.

* * * * *